United States Patent
Mo et al.

(10) Patent No.: US 7,411,820 B2
(45) Date of Patent: Aug. 12, 2008

(54) THREE-LEVEL NONVOLATILE SEMICONDUCTOR MEMORY DEVICE AND ASSOCIATED METHOD OF OPERATION

(75) Inventors: Hyun Sun Mo, Seoul (KR); Ho Jung Kim, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 128 days.

(21) Appl. No.: 11/595,923

(22) Filed: Nov. 13, 2006

(65) Prior Publication Data

US 2007/0177434 A1    Aug. 2, 2007

(30) Foreign Application Priority Data

Feb. 1, 2006    (KR) ............... 10-2006-0009631

(51) Int. Cl.
*G11C 11/34* (2006.01)
(52) U.S. Cl. .................. 365/185.03; 365/185.12
(58) Field of Classification Search ............ 365/185.03, 365/185.12, 185.17
See application file for complete search history.

(56) References Cited

U.S. PATENT DOCUMENTS

| | | | |
|---|---|---|---|
| 6,549,457 B1 | 4/2003 | Srinivasan et al. | |
| 6,847,550 B2 | 1/2005 | Park | |
| 7,173,859 B2 * | 2/2007 | Hemink | 365/185.28 |
| 7,187,584 B2 * | 3/2007 | Chang | 365/185.17 |
| 7,336,538 B2 * | 2/2008 | Crippa et al. | 365/185.12 |

FOREIGN PATENT DOCUMENTS

KR    1020040090486    10/2004

\* cited by examiner

*Primary Examiner*—Anh Phung
(74) *Attorney, Agent, or Firm*—Volentine & Whitt, PLLC

(57) ABSTRACT

A nonvolatile semiconductor memory device comprises a memory array of 3-level nonvolatile memory cells. The memory array comprises first even and odd strings of memory cells connected to respective first even and odd bit lines and second even and odd strings of memory cells connected to respective second even and odd bit lines. The first even and odd bit lines are selectively connected to a first common bit line during data programming and read operations, and the second even and odd bit lines are selectively connected to a second common bit line during data programming and read operations. The device programs and reads data in a pair of memory cells using three bits of data corresponding to three threshold voltage distributions of the 3-level nonvolatile memory cells.

23 Claims, 29 Drawing Sheets

<RESULTS OF READING OF PREVIOUS DATA>

| BIT3 | PREVIOUS DATA VALUE BIT1/BIT2 | AFTER READING DLT1/DLT2 | CASE |
|---|---|---|---|
| 0 | (1/1) | L/L | CASE31 |
| | (1/0) | H/L | CASE32 |
| | (0/1) | L/H | CASE33 |
| | (0/0) | H/L | CASE34 |
| 1 | (DON'T CARE) | H/H | CASE35 |

FIG. 16

THREE-LEVEL NONVOLATILE SEMICONDUCTOR MEMORY DEVICE AND ASSOCIATED METHOD OF OPERATION

BACKGROUND OF THE INVENTION

1. Field of the Invention

Embodiments of the invention relate generally to semiconductor memory devices. More particularly, embodiments of the invention relate to nonvolatile semiconductor memory devices having three-level memory cells, and methods of operating the nonvolatile semiconductor memory devices.

This application claims priority to Korean Patent Application No. 10-2006-9631 filed on Feb. 1, 2006, the subject matter of which is incorporated by reference in its entirety.

2. Description of Related Art

Nonvolatile semiconductor memory devices retain stored data even when disconnected from an external power source. Accordingly, these types of memory devices are an especially popular way of providing long term data storage in electronic devices where power is limited or may be cut off, such as portable electronic devices.

There are a wide variety of nonvolatile memory devices, including, for example, ferroelectric random access memories (FRAMs), nonvolatile random access memories (NRAMs), erasable programmable read only memories (EPROMs), and electrically erasable programmable read only memories (EEPROMs), to name but a few. However, one especially popular form of nonvolatile memory is flash memory. Flash memory is a type of EEPROM where each memory cell is formed of a single metal-oxide semiconductor (MOS) transistor.

FIG. 1 shows an example of a typical flash memory cell. Referring to FIG. 1, a flash memory cell MC comprises a source "S" and a drain "D" formed in a semiconductor substrate. A current path is formed between source S and drain D. Memory cell MC further comprises a gate oxide film GOX formed on the semiconductor substrate, a floating gate FG formed on gate oxide film GOX, a dielectric oxide DOX film formed on floating gate FG, and a control gate CG formed on dielectric oxide DOX.

Memory cell MC is programmed to store data by applying appropriate bias voltages to control gate CG, drain D and source S, and the semiconductor substrate so that electrons become trapped in floating gate FG. Electrons can become trapped in floating gate FG, for example, by flowing electrons across the current path between source S and drain D while applying a high voltage to a word line WL connected to control gate CG. The high voltage on word line WL causes electrons flowing between source S and drain D to travel across gate oxide film GOX and become trapped in floating gate FG. Various alternative techniques exist for trapping electrons in floating gate FG, including Fowler-Nordheim tunneling, channel-initiated secondary electron injection, and channel hot electron injection, for example.

Memory cell MC is erased by removing trapped electrons from floating gate FG. This can be accomplished, for example by generating an electrical potential between source S or drain D and control gate CG the trapped electrons leave floating gate FG.

Electrons trapped in floating gate FG of memory cell MC tend to elevate a threshold voltage of memory cell MC. Here, the threshold voltage is a voltage that must be applied to control gate CG in order for current to flow between source S and drain D. In general, the electrons trapped in floating gate FG tend to elevate the threshold voltage of memory cell MC because these electrons partially cancel out an electrical field generated by the voltage applied to control gate CG, and therefore, a higher voltage must be used to cause current to flow between source S and drain D.

Memory cell MC stores one of two data values. These two data values are represented by two threshold voltage distributions illustrated in FIG. 2. Based on the threshold voltage distributions illustrated in FIG. 2, if memory cell MC has a threshold voltage higher than a reference voltage VM, then it stores a data value "0". Otherwise, if the threshold voltage of memory cell MC is lower than reference voltage VM, then it stores a data value "1". Accordingly, memory cell MC can be read by applying reference voltage VM to word line WL and determining whether current flows between source S and drain D.

In order to increase the amount of data that can be stored within a small area of a flash memory device, researchers have developed flash memory devices capable of storing data in more than two states. This is typically accomplished by a memory cell exhibiting more than two distinct threshold voltage distributions. For example, FIG. 3 illustrates four threshold voltage distributions for a memory cell capable of storing data in one of four different states. In general, the term "n-level nonvolatile memory cell" will be used in this written description to refer to memory cells capable of storing data in "n" different states. Accordingly, terms such as 2-level nonvolatile memory cell and 4-level nonvolatile memory cell are used to describe memory cells capable of storing data with 2 or 4 states, respectively.

A 4-level memory cell has twice the storage capacity of a 2-level memory cell. However, the margins between adjacent threshold voltage distributions in the 4-level memory cells are typically very small, for example, about 0.67V. Accordingly, 4-level memory cells tend to be more susceptible to errors than 2-level memory cells due to shifts in the threshold voltage distributions. These shifts can be caused, for example, by leakage currents.

Because the 4-level memory cells are more error prone than 2-level memory cells, the benefit of the additional storage capacity of the 4-level memory cells may be outweighed by their lack of reliability.

SUMMARY OF THE INVENTION

Recognizing the limitations of conventional nonvolatile semiconductor memory devices, embodiments of the invention provide nonvolatile semiconductor devices and associated methods adapted to provide increased levels of integration and reliability relative to the conventional devices.

According to one embodiment of the invention, a nonvolatile semiconductor memory device comprises a memory array, a page buffer, and a row decoder. The memory array comprises first even and odd strings of nonvolatile memory cells connected to a first even bit line and a first odd bit line, respectively, and second even and odd strings of nonvolatile memory cells connected to a second even bit line and a second odd bit line, respectively. The first even bit line and the first odd bit line are selectively connected to a first common bit line during programming and read operations, and the second even bit line and the second odd bit line are selectively connected to a second common bit line during programming and read operations. The page buffer is coupled to the memory array through the first and second common bit lines and is configured to drive the first and second common bit lines to map first through third bits to levels of threshold voltage distributions of first and second memory cells forming a pair. The row decoder is configured to control a word line of a selected memory cell of the memory array. The first and second memory cells forming the pair are connected to the same word line and are arranged in the first and second even strings, respectively, or in the first and second odd strings, respectively.

According to another embodiment of the invention, a method of operating a nonvolatile semiconductor memory device is provided. The nonvolatile memory device comprises a memory array including first even and odd strings of memory cells connected to respective first even and odd bit lines and second even and odd strings of memory cells connected to respective second even and odd bit lines. The first even and odd bit lines are selectively connected to a first common bit line during data programming and read operations, and the second even and odd bit lines are selectively connected to a second common bit line during data programming and read operations. The method comprises primarily controlling threshold voltages of first and second memory cells based on first and second bits, and then secondarily controlling the threshold voltages of the first and second memory cells based on a third bit. The first and second memory cells are connected to the same word line and are arranged in the first and second even strings, respectively, or in the first and second odd strings, respectively.

According to still another embodiment of the invention, another method of operating a nonvolatile semiconductor memory device is provided. The nonvolatile memory device comprises a memory array including first even and odd strings of memory cells connected to respective first even and odd bit lines and second even and odd strings of memory cells connected to respective second even and odd bit lines. The first even and odd bit lines are selectively connected to a first common bit line during data programming and read operations, and the second even and odd bit lines are selectively connected to a second common bit line during data programming and read operations. The method comprises (a) detecting the levels of threshold voltages of first and second memory cells relative to a second reference voltage through respective first and second common bit lines; (b) switching first and second latch data based on respective voltage levels of the first and second common bit lines during (a); (c) reflecting the level of the threshold voltage of the first or second memory cell relative to a first reference voltage and a voltage level of the first latch data, on the second common bit line; and (d) switching the second latch data based on the voltage level of the second common bit line during (c). The first and second memory cells are controlled by the same word line and are arranged in the first and second even strings, respectively, or in the first and second odd strings, respectively.

According to still another embodiment of the invention, a method of operating a nonvolatile semiconductor memory device is provided. The nonvolatile memory device comprises a memory array including first even and odd strings of memory cells connected to respective first even and odd bit lines and second even and odd strings of memory cells connected to respective second even and odd bit lines. The first even and odd bit lines are selectively connected to a first common bit line during data programming and read operations, and the second even and odd bit lines are selectively connected to a second common bit line during data programming and read operations. The method comprises (a) detecting the levels of threshold voltages of first and second memory cells relative to a predetermined reference voltage through respective first and second common bit lines; (b) switching first and second latch data depending on respective voltage levels of the first and second common bit lines obtained by (a); (c) reflecting a voltage level of the first latch data on the second common bit line; and (d) switching the second latch data depending on a voltage level of the second common bit line obtained by (c). The first and second memory cells are controlled by the same word line and are arranged in the first and second even strings, respectively, or in the first and second odd strings, respectively.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings:

FIG. 16 is a diagram illustrating states of first and second latch data during the third page programming operation;

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
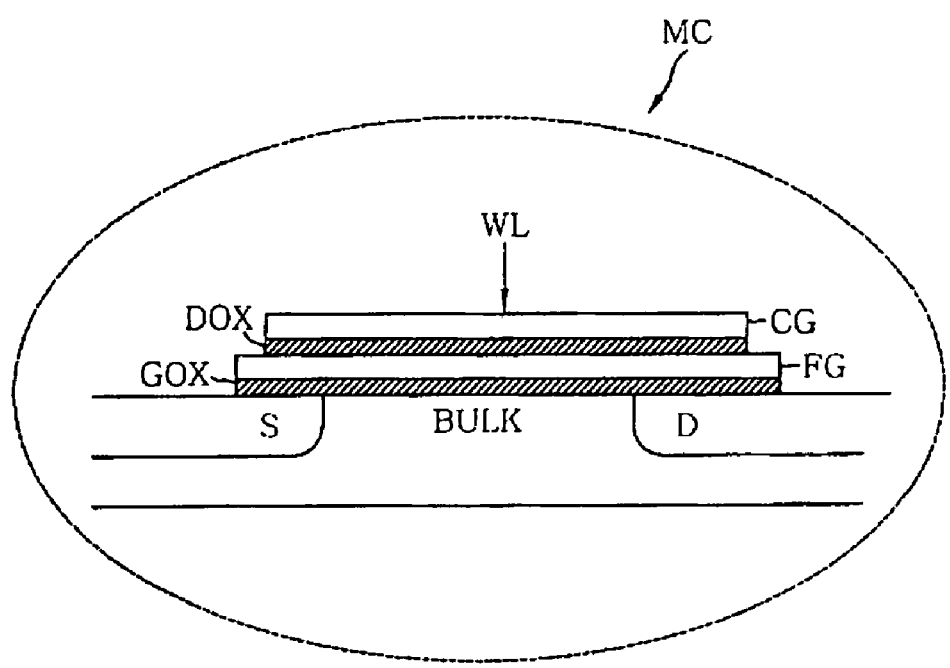
FIG. 1 is a schematic diagram of a conventional flash memory cell.
Figure 2:
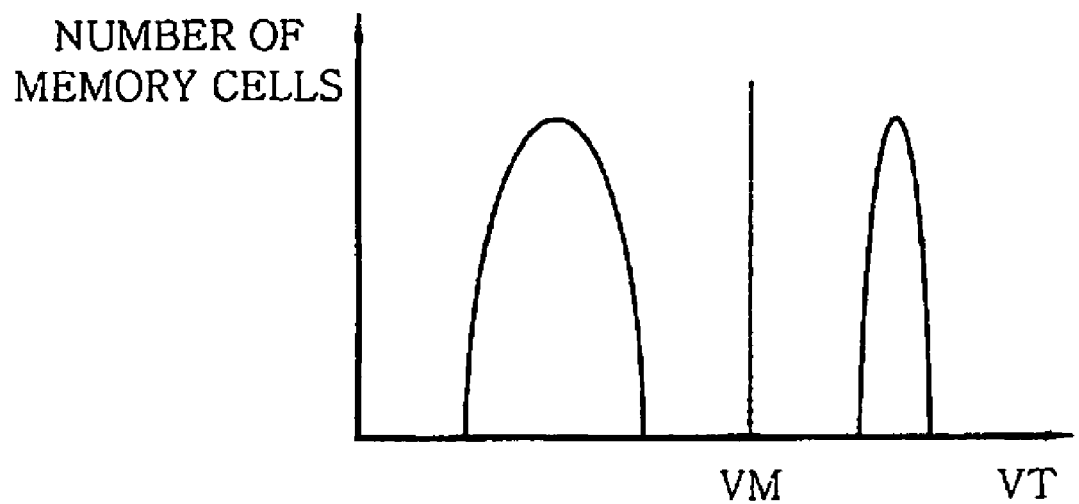
FIG. 2 is a graph illustrating threshold voltage distributions of a 2-level memory cell.
Figure 3:
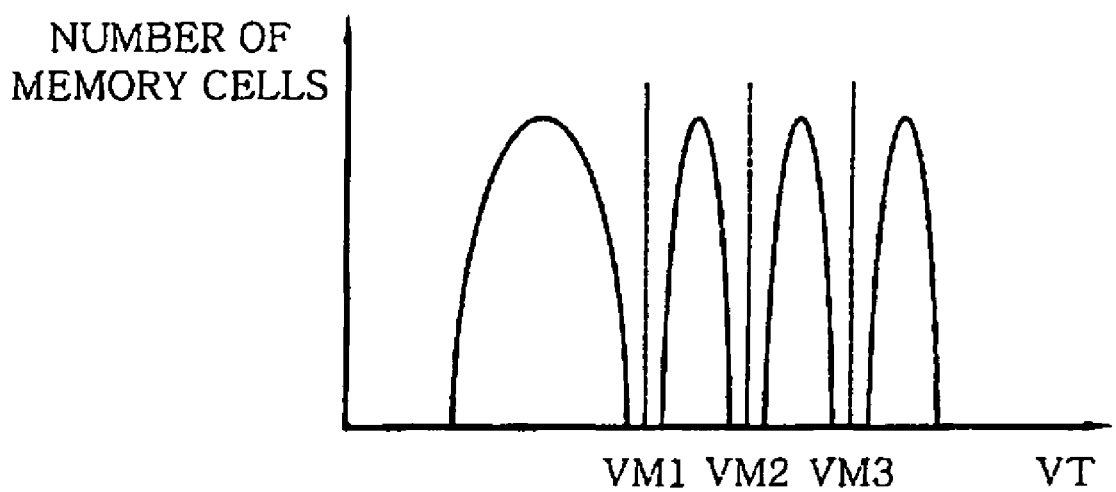
FIG. 3 is a graph illustrating threshold voltage distributions of a 4-level memory cell.
Figure 4:
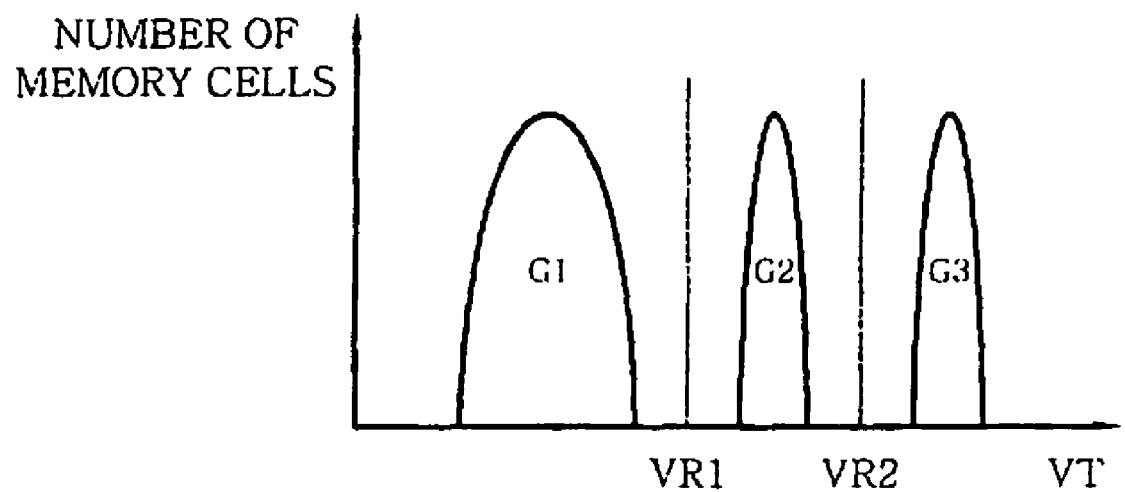
FIG. 4 is a graph illustrating the threshold voltage distributions of a 3-level memory cell.

Embodiments of the invention relate generally to nonvolatile semiconductor memory devices having 3-level memory cells. As an example, FIG. 4 illustrates threshold voltage distributions for a 3-level memory cell MC. The different threshold voltage distributions of FIG. 4 can be distinguished from each other in a read operation using first and second reference voltages VR1 and VR2.

In this written description, a threshold voltage distribution lower than first reference voltage VR1 will be referred to as a "first threshold voltage distribution G1". A threshold voltage distribution between first reference voltage VR1 and second reference voltage VR2 will be referred to as a "second threshold voltage distribution G2". Finally, a threshold voltage distribution greater than second reference voltage VR2 will be referred to as a "third threshold voltage distribution G3".

When 3-level memory cell MC is programmed, first and second verify read threshold voltages, which are slightly higher than first and second reference voltages VR1 and VR2, respectively, are used to verify whether a programming operation has changed the threshold voltage of 3-level memory cell MC to within a desired threshold voltage distribution.

3-level memory cell MC provides more data storage than a 2-level memory cell and therefore allows memory devices to have a higher degree of integration. In addition, 3-level memory cell MC has larger margins between adjacent threshold voltage distributions compared with a 4-level memory cell, and therefore it has a higher degree of reliability.

Accordingly, nonvolatile semiconductor memory devices having 3-level memory cells, i.e., "3-level nonvolatile semiconductor memory devices", have advantages over other types of nonvolatile semiconductor memory devices in terms of either the degree of integration or reliability.

Figure 5:
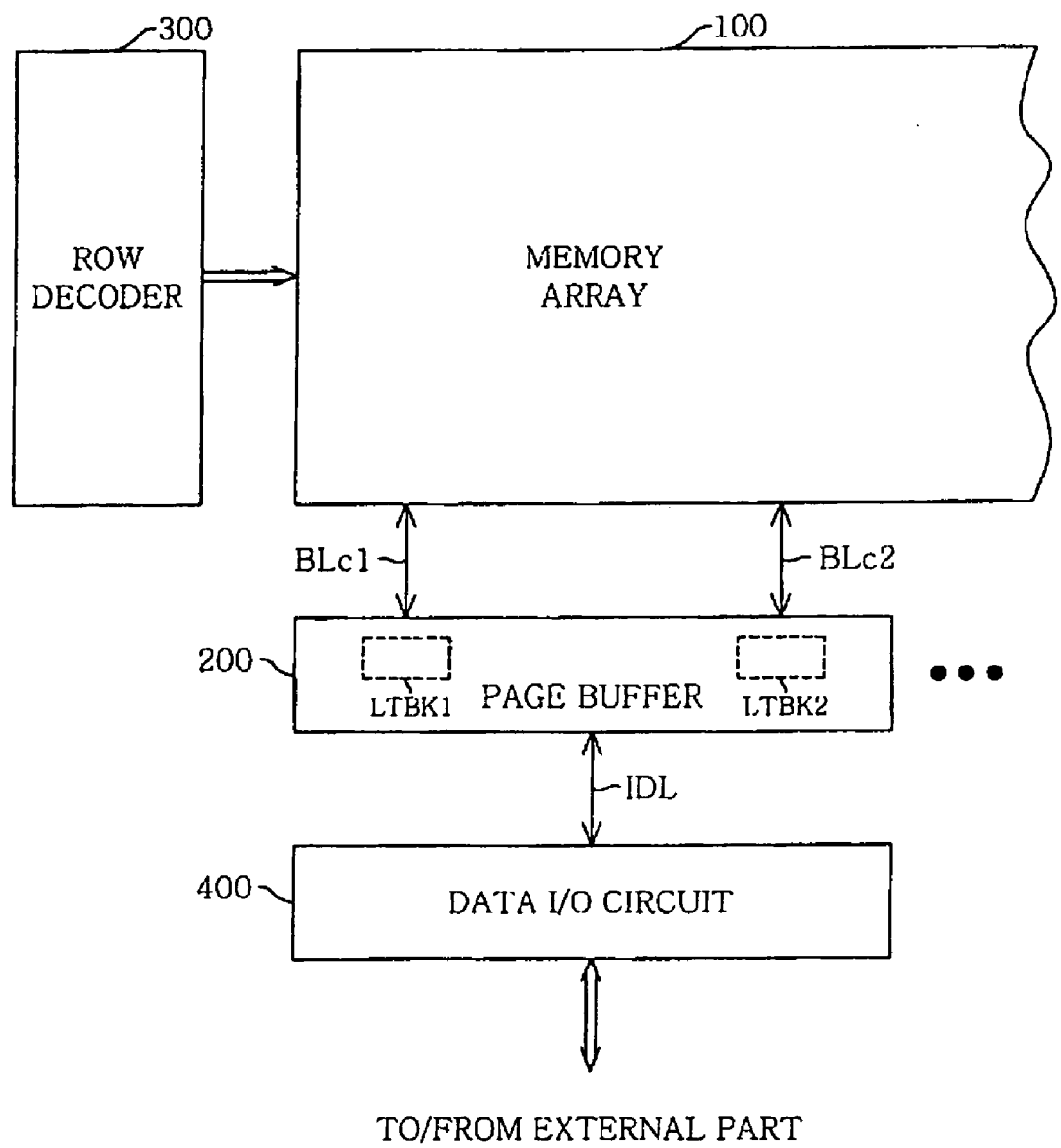
FIG. 5 is a diagram illustrating a part of a nonvolatile semiconductor memory device according to one embodiment of the invention.

FIG. 5 is a diagram illustrating a part of a nonvolatile semiconductor memory device according to an embodiment of the present invention. Referring to FIG. 5, the nonvolatile semiconductor memory device comprises a memory array 100, a page buffer 200, a row decoder 300, and a data I/O circuit 400.

Figure 6:
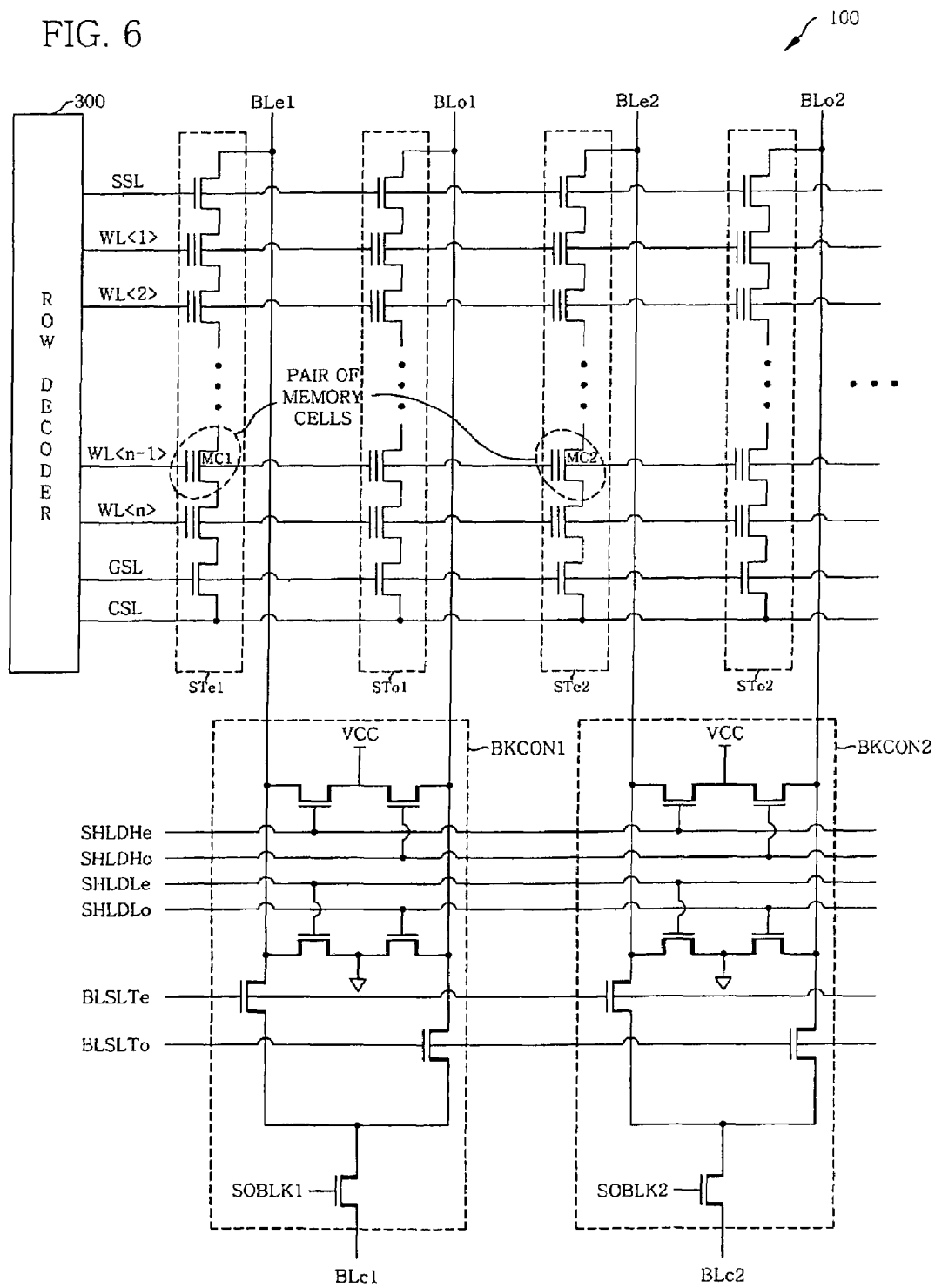
FIG. 6 is a circuit diagram illustrating a part of the memory array of FIG. 5 according to one embodiment of the invention.

Memory array 100 comprises a plurality of 3-level memory cells arranged in a row/column matrix structure. FIG. 6 is a circuit diagram illustrating an embodiment of memory array 100 when the nonvolatile semiconductor memory device is a NAND-type nonvolatile semiconductor memory device.

Referring to FIG. 6, memory array 100 comprises a first even string STe1, a first odd string STo1, a second even string STe2, and a second odd string STo2. First even string STe1, first odd string STo1, second even string STe2, and second odd string STo2 are connected to a first even bit line BLe1, a first odd bit line BLo1, a second even bit line BLe2, and a second odd bit line BLo2, respectively.

First even bit line BLe1 and first odd bit line BLo1 are selectively connected to a first common bit line BLc1 through a first common bit line control block BKCON1 during programming and read operations of the nonvolatile semiconductor memory device. In particular, where an even bit line selection signal BLSLTe and a first sensing bit line signal SOBLK1 are activated to a logic state "high" ("H"), first even bit line BLe1 is connected to first common bit line BLc1; where an odd bit line selection signal BLSLTo and first sensing bit line signal SOBLK1 are activated to logic state "high", first odd bit line BLo1 is connected to first common bit line BLc1.

Second even bit line BLe2 and second odd bit line BLo2 are selectively connected to a second common bit line BLc2 through a second common bit line control block BKCON2 during data programming and read operations of the nonvolatile semiconductor memory device. In particular, where even bit line selection signal BLSLTe and a second sensing bit line signal SOBLK2 are activated to logic state "high", second even bit line BLe2 is connected to second common bit line BLc2; where odd bit line selection signal BLSLTo and second sensing bit line signal SOBLK2 are activated to logic state "high", second odd bit line BLo2 is connected to second common bit line BLc2.

First common bit line control block BKCON1 drives first even bit line BLe1 and first odd bit line BLo1 with a supply voltage VDD or a ground voltage VSS. Similarly, second common bit line control block BKCON2 drives second even bit line BLe2 and second odd bit line BLo2 with supply voltage VDD or ground voltage VSS. More specifically, first and second common bit line control blocks BKCON1 and BKCON2 drive respective first and second even bit lines BLe1 and BLe2 with supply voltage VDD in response to an even voltage shielding signal SHLDHe with logic state "high". Similarly, first and second common bit line control blocks BKCON1 and BKCON2 drive respective first and second odd bit lines BLo1 and BLo2 with supply voltage VDD in response to an odd voltage shielding signal SHLDHo with logic state "high". Likewise, first and second common bit line control blocks BKCON1 and BKCON2 drive respective first and second even bit lines BLe1 and BLe2 with ground voltage VSS in response to even voltage shielding signal SHLDLe with logic state "low", and respective first and second odd bit lines BLo1 and BLo2 with ground voltage VSS in response to odd voltage shielding signal SHLDLo with logic state "low".

First even string STe1, first odd string STo1, second even string STe2 and second odd string STo2 each comprise a plurality of memory cells MCs. In this written description, memory cells included in first even string STe1 or first odd string STo1 will be referred to as a "first memory cells", and memory cells included in second even string STe2 or second odd string STo2 will be referred to as a second memory cells.

The first and second memory cells are typically the same type of memory cells, can be electrically programmed and erased, and provide nonvolatile data storage.

The first and second memory cells can be arranged in pairs located within even strings and controlled by the same word line as illustrated by the broken ovals in FIG. 6. Similarly, the first and second memory cells can also be arranged in pairs located in odd strings and controlled by the same word line.

As an example, FIG. 6 shows a single first memory cell MC1 included in first even string STe1, and a single second memory cell MC2 included in second even string STe2, forming a pair. Likewise, a single first memory cell in first odd string STo1 and a single second memory cell in second odd string STo2 also form a pair.

Data is typically programmed to or read from the memory cells of a pair in a single read or program or read operation. Methods of programming and reading pairs of memory cells are described in further detail below. In the programming methods, it is assumed that the three threshold voltage distributions characterizing each memory cell in each pair of 3-level memory cell can be represented by a set of three bits BIT1 through BIT3.

Where first and second memory cells MC1 and MC2 within first and second even strings STe1 and STe2 are selected and driven, first and second odd bit lines BLo1 and BLo2 function as shielding lines. Similarly, where a pair of first and second memory cells in first and second odd strings STo1 and STo2 are selected and driven, first and second even bit lines BLe1 and BLe2 function as shielding lines. In this way, even bit lines BLe1 and BLe2 or odd bit lines BLo1 and BLo2 function as shielding lines, thus preventing noise and capacitative coupling. Accordingly, the performance of the nonvolatile semiconductor memory device is protected against degradation.

Referring again to FIG. 5, page buffer 200 is coupled to memory array 100 through first and second common bit lines BLc1 and BLc2. Page buffer 200 is driven to map first through third bits BIT1 to BIT3 to corresponding threshold voltage distributions of first and second memory cells MC1 and MC2.

Figure 7:
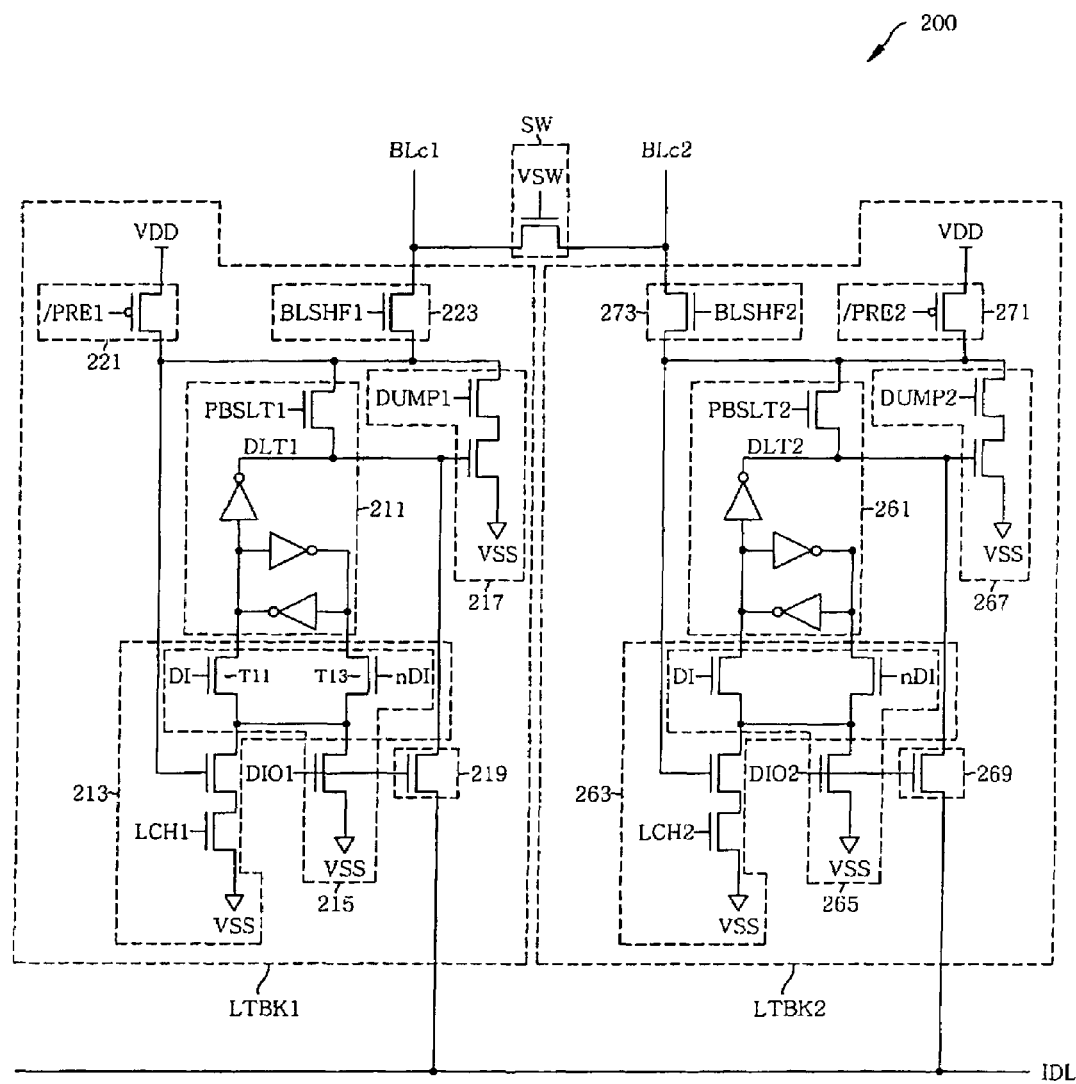
FIG. 7 is a circuit diagram illustrating the page buffer of FIG. 5 in further detail.

FIG. 7 is a circuit diagram illustrating one embodiment of page buffer 200. Referring to FIG. 7, page buffer 200 includes a switch SW, a first latch block LTBK1 and a second latch block LTBK2.

Switch SW connects first common bit line BLc1 to second common bit line BLc2 in response to a switching signal VSW.

First latch block LTBK1 can store first latch data DLT1, and is connected to first common bit line BLc1. First buffer block LTBK1 includes a first sensing terminal NSEN1, a first latch unit 211, a first switching unit 213, a first latch control unit 215, and a first dumping unit 217.

First sensing terminal NSEN1 is connected to first common bit line BLc1 in response to a first bit line connection signal BLSHF1. In this case, data on the first sensing terminal NSEN1 can be provided to the first common bit line BLc1 through a first bit line connection unit 223.

First latch unit 211 latches and stores first latch data DLT1. Further, first latch unit 211 transmits first latch data DLT1 to first common bit line BLc1 in response to a first buffer selection signal PBSLT1.

First switching unit 213 can switch (or "flop") first latch data DLT1 from a logic state "low" ("L") to logic state "high" based on a voltage level of first sensing terminal NSEN1 when an input signal DI has logic state "high". Similarly, first switching unit 213 can switch first latch data DLT1 from logic state "high" to logic state "low" based on the voltage level of first sensing terminal NSEN1 when an inverted input signal nDI is activated to logic state "high".

First latch control unit 215 sets first latch data DLT1 to logic state "high" when input signal DI has logic state "high" and a first output control signal DIO1 has logic state "high". First latch control unit 215 resets first latch data DLT1 to logic state "low" when inverted input signal nDI has logic state "high" and output control signal DIO1 has logic state "high".

An NMOS transistor T11 gated by input signal DI and an NMOS transistor T13 gated by inverted input signal nDI are included in both first switching unit 213 and first latch control unit 215.

First dumping unit 217 discharges first sensing terminal NSEN1 to ground voltage VSS in response to first latch data DLT1. In particular, first dumping unit 217 discharges first sensing terminal NSEN1 to ground voltage VSS in response to a first dumping signal DUMP1 when first latch data DLT1 has logic state "high". Therefore, first dumping unit 217 functions to invert first latch data DLT1 in logic state "high", and provide the inverted data to first sensing terminal NSEN1.

First buffer block LTBK1 typically further comprises a first output unit 219, a first precharge unit 221, and first bit line connection unit 223.

First output unit 219 occasionally provides first latch data DLT1 latched in first latch unit 211 to an internal data line IDL in response to first output control signal DIO1.

First precharge unit 221 precharges first sensing terminal NSEN1 to supply voltage VDD in response to a first sensing precharge signal /PRE1.

First bit line connection unit 223 controls an electrical connection between first common bit line BLc1 and first sensing terminal NSEN1 in response to a first bit line connection signal BLSHF1.

Referring to FIG. 7, second latch block LTBK2 can store second latch data DLT2 and is connected to second common bit line BLc2. Second buffer block LTBK2 includes a second sensing terminal NSEN2, a second latch unit 261, a second switching unit 263, a second latch control unit 265, and a second dumping unit 267, and further includes a second output unit 269, a second precharge unit 271, and a second bit line connection unit 273.

Second sensing terminal NSEN2, second latch unit 261, second switching unit 263, second latch control unit 265, second dumping unit 267, second output unit 269, second precharge unit 271, and second bit line connection unit 273 of second latch block LTBK2 have the same constructions and perform the same operations as first sensing terminal NSEN1, first latch unit 211, first switching unit 213, first latch control unit 215, first dumping unit 217, first output unit 219, first precharge unit 221, and first bit line connection unit 223 of first latch block LTBK1, respectively. Accordingly, a detailed explanation of these components is omitted to avoid redundancy.

Referring again to FIG. 5, row decoder 300 is coupled to memory array 100. Row decoder 300 controls the voltage level of a selected word line WL and generates a string selection signal SSL and a ground selection signal GSL. Data input/output (I/O) circuit 400 outputs data latched in page buffer 200 to an external system, and loads data received from the external system into page buffer 200. Typically, the external system provides first through third bits BIT1 through BIT3 to data I/O circuit 400 and first through third bits are transferred from data I/O circuit 400 to page buffer 200 via internal data line IDL.

A programming method for the nonvolatile semiconductor memory device shown in FIG. 5 will be described below. In the description that follows, the programming method is described in relation to a pair of memory cells that are programmed by a sequence of first through third page programming operations using first through third bits BIT1 through BIT3, respectively.

Figure 8:
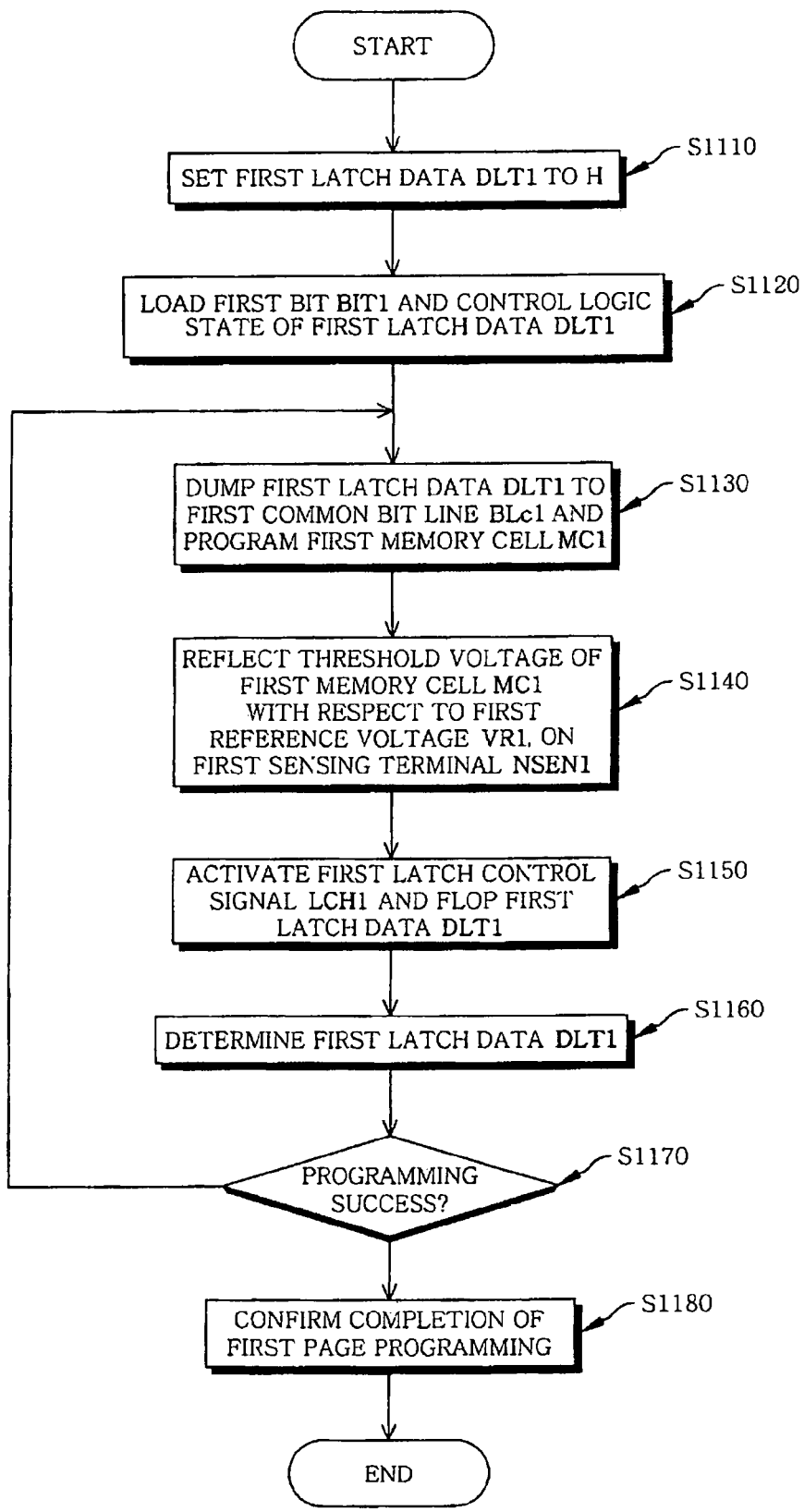
FIG. 8 is flowchart illustrating a first page programming operation in a programming method for a nonvolatile semiconductor memory device according to an embodiment of the invention.
Figure 9:
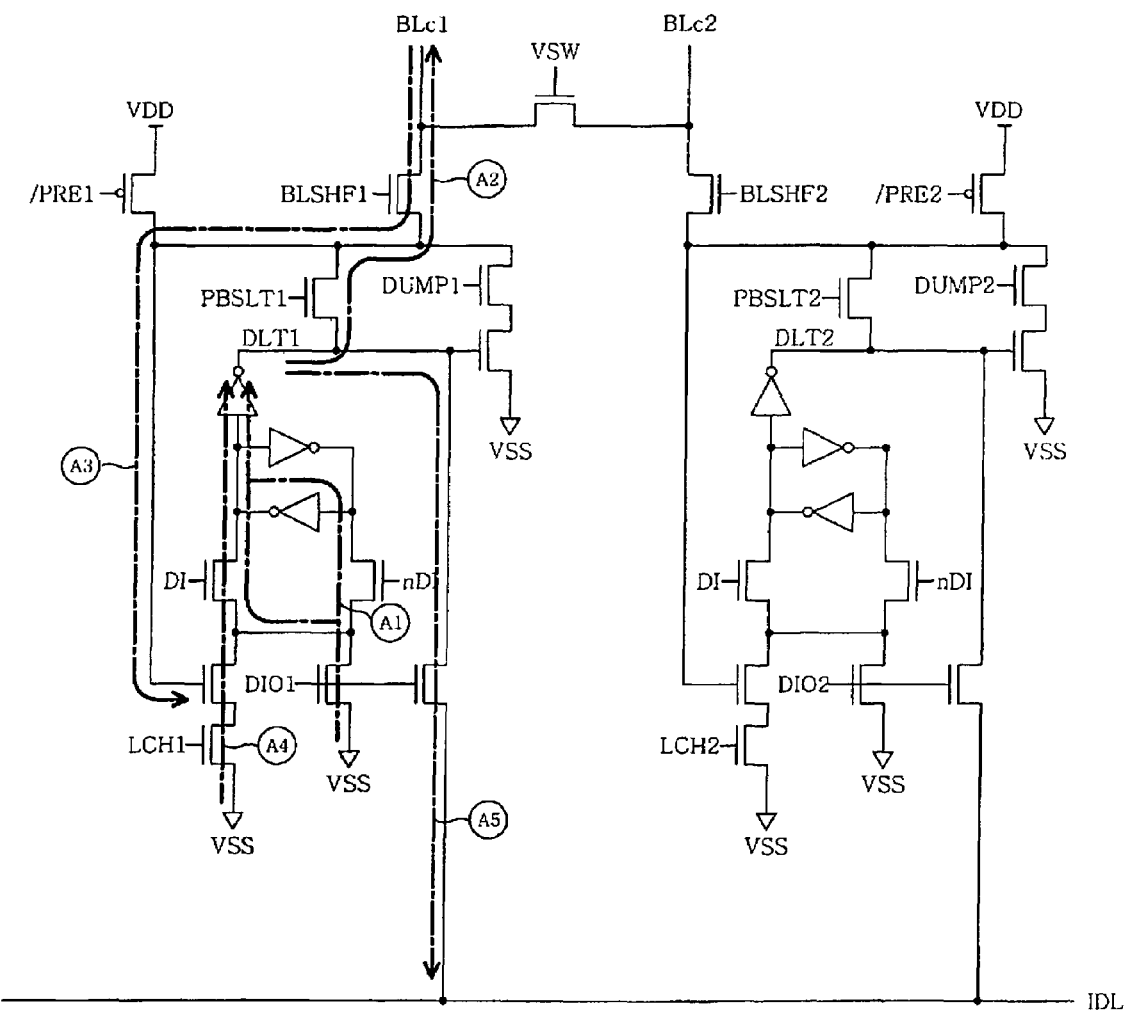
FIG. 9 is a data flow diagram corresponding to the flowchart of FIG. 8.

FIGS. 8 and 9 are a flowchart and a data flow diagram, respectively, illustrating a first page programming operation for first and second memory cells MC1 and MC2. In the first page programming operation, the threshold voltage of first memory cell MC1 is programmed to within second threshold voltage distribution G2, depending on the value of first bit BIT1.

Referring to FIG. 8, in a step S1110, first latch data DLT1 is set to logic state "high". Next, in a step S1120, first bit BIT1 is loaded into first latch data DLT1 (See, A1 in FIG. 9). In particular, where first bit BIT1 is a logical "0" (or "0" for short), inverted input signal nDI is activated to logic state "high" so that first latch data DLT1 is latched as logic state "low". Meanwhile, where first bit BIT1 is a logical "1" (or "1" for short), input signal DI is activated to logic state "high", and first latch data DLT1 is maintained in logic state "high".

Thereafter, in a step S1130, first latch data DLT1 is dumped onto first common bit line BLc1 to program first memory cell MC1 (See, A2 in FIG. 9). For example, where first bit BIT1 is "0", the threshold voltage of first memory cell MC1 is increased. In contrast, where first bit BIT1 is "1", the threshold voltage of first memory cell MC1 remains in its current state.

Next, in a step S1140, the value of the threshold voltage of first memory cell MC1 relative to first reference voltage VR1 is reflected (i.e., is indicated or becomes apparent) on first sensing terminal NSEN1 through first common bit line BLc1 (See, A3 in FIG. 9). In other words, the level of a voltage transmitted to first sensing terminal NSEN1 through first common bit line BLc1 is determined by whether the threshold voltage of first memory cell MC1 is greater than or equal to first reference voltage VR1. More particularly, where the threshold voltage of first memory cell MC1 is higher than first reference voltage VR1, the voltage levels of first common bit line BLc1 and first sensing terminal NSEN1 are driven to supply voltage VDD. In contrast, where the threshold voltage of first memory cell MC1 is lower than first reference voltage VR1, the voltage levels of first common bit line BLc1 and first sensing terminal NSEN1 are driven to ground voltage VSS.

In a step S1150, a first latch control signal LCH1 is generated as a pulse with logic state "high". In response to the pulse, first latch data DLT1 selectively switches from logic state "low" to logic state "high" based on the voltage level of first sensing terminal NSEN1 (See, A4 in FIG. 9). In particular, where the voltage level of first sensing terminal NSEN1 is close to supply voltage VDD, first latch data DLT1 switches from logic state "low" to logic state "high". In contrast, where the voltage level of first sensing terminal NSEN1 is close to ground voltage VSS, first latch data DLT1 remains in its current state.

Where first latch data DLT1 is in logic state "low" after step S1150, the threshold voltage of first memory cell MC1 has not been increased to within second threshold voltage distribution G2.

In a step S1160, first output control signal DIO1 is generated as a pulse with logic state "high". In response to the pulse, the logic state of first latch data DLT1 is read and transferred out of the semiconductor memory device through internal data line IDL (See, A5 in FIG. 9). Next, in a step S1170, the success or failure of the first page programming operation is determined based on the logic state of first latch data DLT1 read out of the semiconductor memory device. Where the logic state of first latch data DLT1 read in step S1160 is "high", first memory cell MC1 has been successfully programmed. Otherwise, where the logic state of first latch data DLT1 read in step S1160 is "low", first memory cell MC1 has not been successfully programmed, i.e., a "programming failure" is detected.

Where a programming failure is detected, steps S1130 through S1170 are repeated with an incrementally increased word line voltage applied to first memory cell MC1 in step S1130 to increase the threshold voltage of first memory cell MC1 until a programming success is achieved or optionally until a predetermined number of iterations have been performed.

Where first memory cell MC1 is detected to be successfully programmed in step S1170, completion of the first page programming operation is confirmed in a step S1180.

Figure 10:
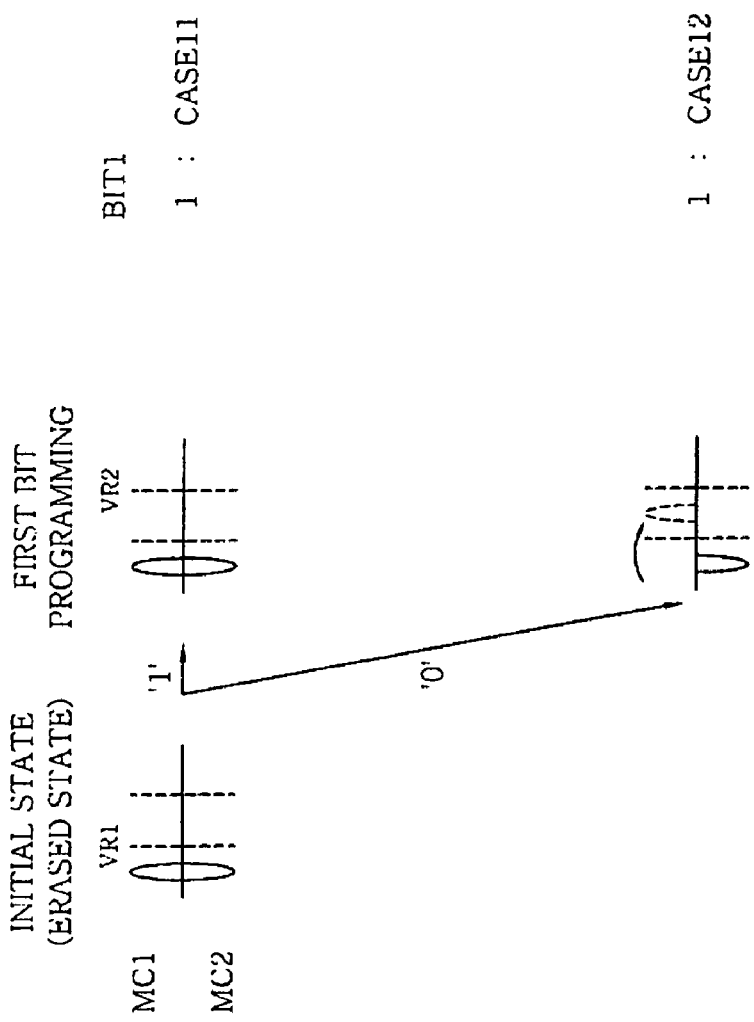
FIG. 10 is a diagram illustrating variation in the threshold voltages of first and second memory cells after the first page programming operation has been performed.

FIG. 10 is a diagram illustrating variation in the threshold voltages of first and second memory cells MC1 and MC2 after the first page programming operation has been performed in the programming method illustrated in FIGS. 8 and 9.

Referring to FIG. 10, where first bit BIT1 is "1" (CASE11), the threshold voltages of first and second memory cells MC1 and MC2 are maintained in an erased state, i.e., within first threshold voltage distribution G1.

Where first bit BIT1 is "0" (CASE12), the threshold voltage of first memory cell MC1 is increased to within second threshold voltage distribution G2, and the threshold voltage of second memory cell MC2 is maintained within first threshold voltage distribution G1.

Figure 11:
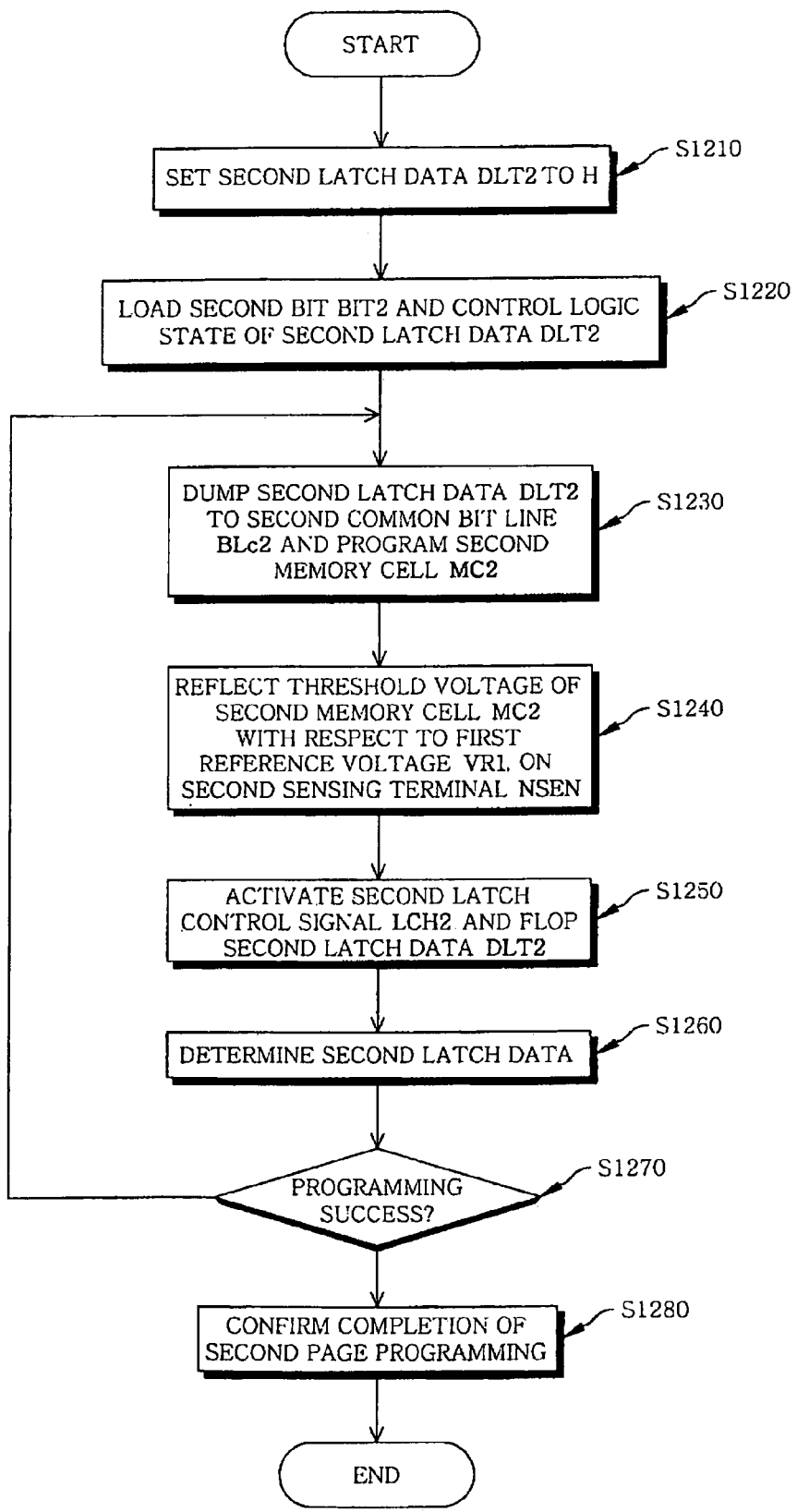
FIG. 11 is a flowchart illustrating a second page programming operation in the programming method.
Figure 12:
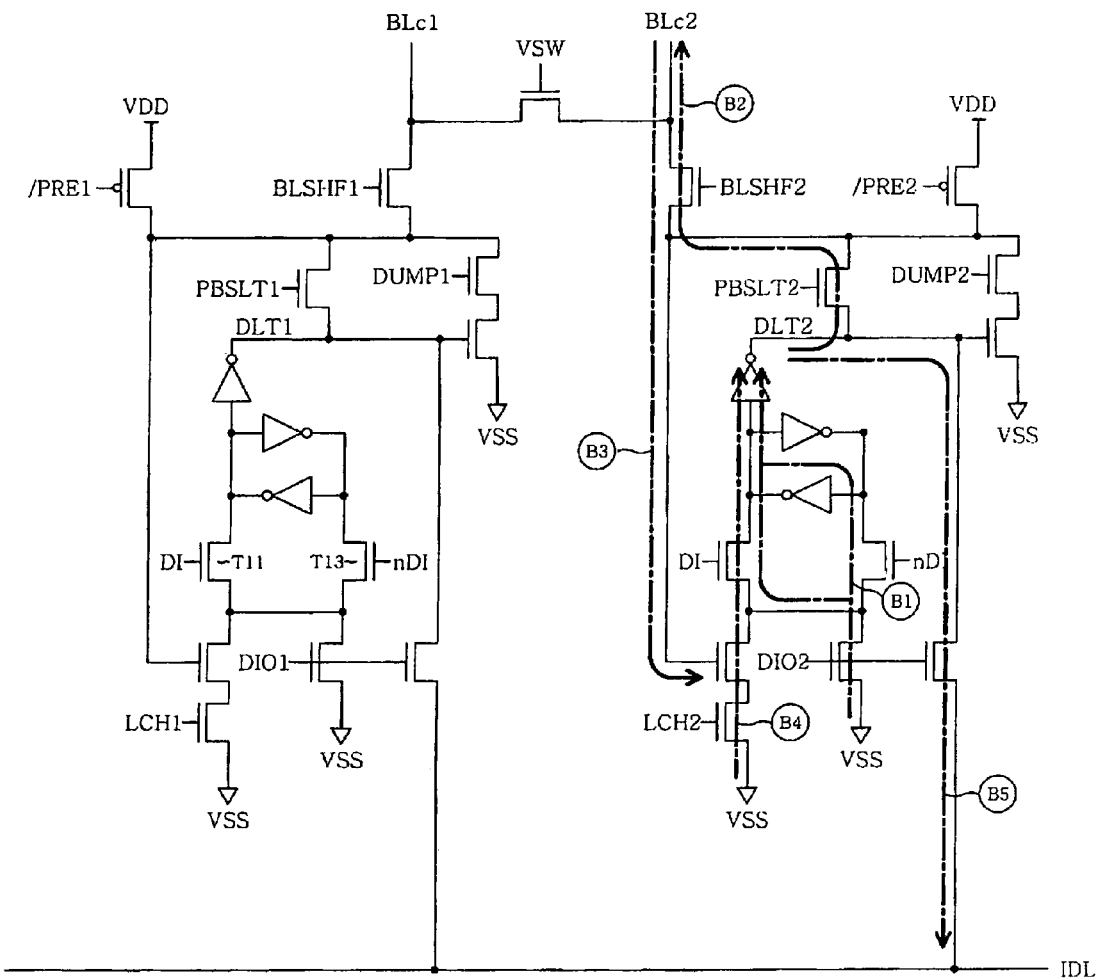
FIG. 12 is a data flow diagram corresponding to the flowchart of FIG. 11.

FIGS. 11 and 12 are a flowchart and a data flow diagram illustrating a second page programming operation in the programming method. In the second page programming operation, the threshold voltage of second memory cell MC2 is programmed to within second threshold voltage distribution G2 depending on the logic state of second bit BIT2.

Referring to FIG. 11, in a step S1210, second latch data DLT2 is set to logic state "high". Next, in a step S1220, second bit BIT2 is loaded as second latch data DLT2 (See, B1 in FIG. 12). In other words, where second bit BIT2 is "0", inverted input signal nDI is activated to logic state "high", so that second latch data DLT2 is latched as logic state "low". Meanwhile, where second bit BIT2 is "1", input signal DI is activated to logic state "high", and second latch data DLT2 is maintained in logic state "high".

Next, in a step S1230, second latch data DLT2 is dumped onto second common bit line BLc2 to program second memory cell MC2 (See, B2 in FIG. 12). In other words, where second bit BIT2 is "0", the threshold voltage of second memory cell MC2 is increased, and where second bit BIT2 is "1", the threshold voltage of second memory cell MC2 remains in its current state.

Next, in a step S1240, the value of the threshold voltage of second memory cell MC2 relative to second reference voltage VR2 is reflected, or indicated, on second sensing terminal NSEN2 through second common bit line BLc2 (See, B3 in FIG. 12). In other words, the level of a voltage transmitted to second sensing terminal NSEN2 through second common bit line BLc2 is determined by whether the threshold voltage of second memory cell MC2 is greater than or equal to second reference voltage VR2. More particularly, where the threshold voltage of second memory cell MC2 is higher than second reference voltage VR2, the voltage levels of second common bit line BLc2 and second sensing terminal NSEN2 are driven to supply voltage VDD. In contrast, where the threshold voltage of second memory cell MC2 is lower than second reference voltage VR2, the voltage levels of second common bit line BLc2 and second sensing terminal NSEN2 are driven to ground voltage VSS.

In a step S1250, a second latch control signal LCH2 is generated as a pulse with logic state "high". In response to the pulse, second latch data DLT2 selectively switches from logic state "low" to logic state "high" based on the voltage level of second sensing terminal NSEN2 (See, B4 in FIG. 12). In particular, where the voltage level of second sensing terminal NSEN2 is close to supply voltage VDD, second latch data DLT2 switches from logic state "low" to logic state "high". In contrast, where the voltage level of second sensing terminal NSEN2 is close to ground voltage VSS, second latch data DLT2 remains in its current state.

Where second latch data DLT2 is in logic state "low" after step S1250, the threshold voltage of second memory cell MC2 has not been increased to within second threshold voltage distribution G2.

In a step S1260, second output control signal DIO2 is generated as a pulse with logic state "high". In response to the pulse, the logic state of second latch data DLT2 is read and transferred out of the semiconductor memory device through internal data line IDL (See, B5 in FIG. 12). Next, in a step S1270, the success or failure of the second page programming operation is determined based on the logic state of second latch data DLT2 read out of the semiconductor memory device. Where the logic state of second latch data DLT2 read in step S1260 is "high", second memory cell MC2 has been successfully programmed. Otherwise, where the logic state of second latch data DLT2 read in step S1260 is "low", second memory cell MC2 has not been successfully programmed, i.e., a "programming failure" has occurred.

Where a programming failure is detected, steps S1230 through S1270 are repeated with an incrementally increased word line voltage applied to memory cell MC2 in step S1230 to increase the threshold voltage of second memory cell MC2 until a programming success is achieved or optionally until a predetermined number of iterations have been performed.

Where second memory cell MC2 is detected to be successfully programmed in step S1270, completion of the second page programming operation is confirmed in a step S1280.

Figure 13:
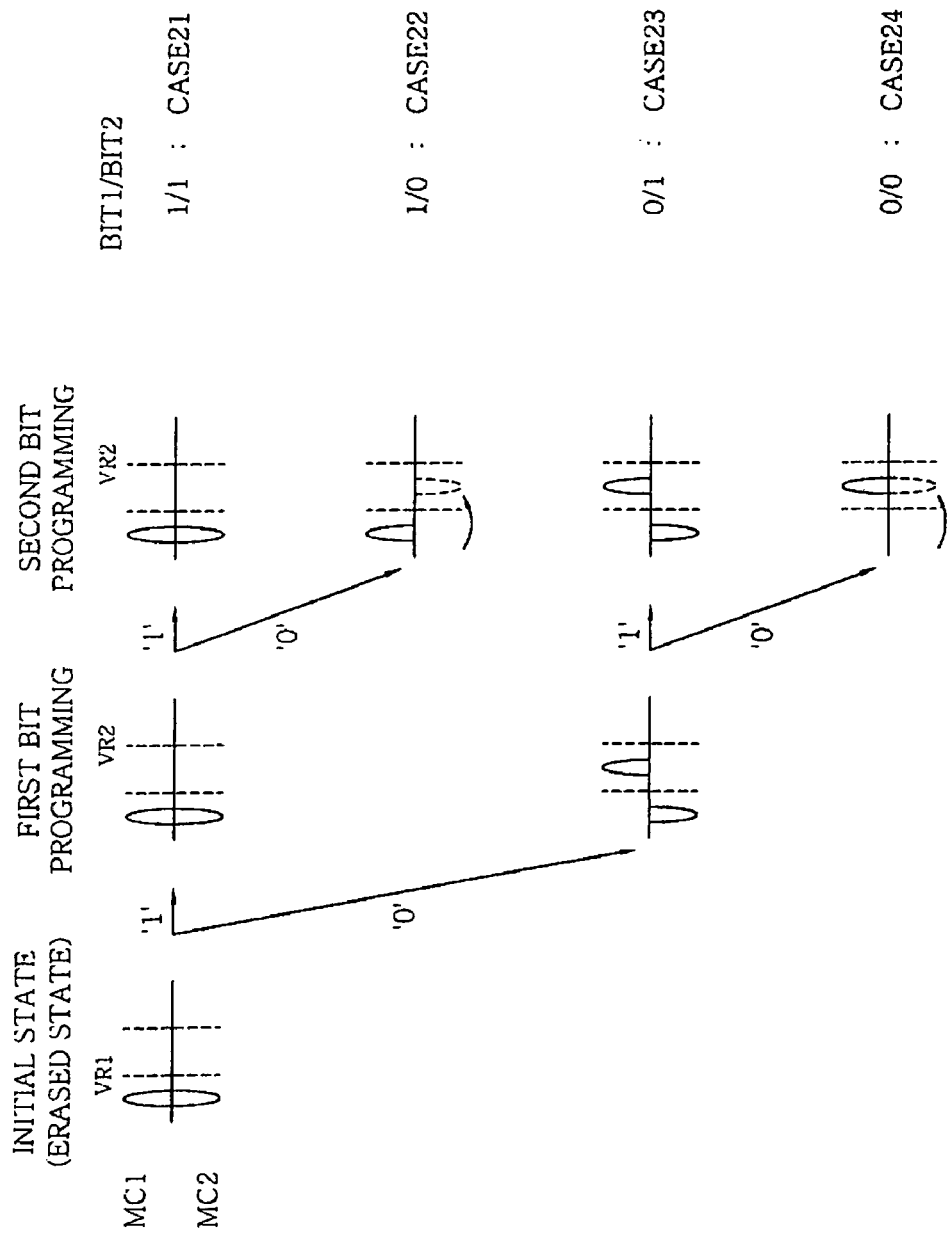
FIG. 13 is a diagram illustrating variation in the threshold voltages of first and second memory cells after the second page programming operation has been performed.

FIG. 13 is a diagram illustrating a variation in the threshold voltages of first and second memory cells MC1 and MC2 after the second page programming operation has been performed.

Where first and second bits BIT1 and BIT2 are both "1" (CASE21), the threshold voltages of the first and second memory cells MC1 and MC2 are maintained in the erased state, i.e., within first threshold voltage distribution G1.

Where first bit BIT1 is "1" and second bit BIT2 is "0" (CASE22), the threshold voltage of first memory cell MC1 is maintained within first threshold voltage distribution G1, and the threshold voltage of second memory cell MC2 is increased to within second threshold voltage distribution G2.

Where first bit BIT1 is "0" and second bit BIT2 is "1" (CASE23), the threshold voltage of first memory cell MC1 is maintained within second threshold voltage distribution G2, and the threshold voltage of second memory cell MC2 is maintained within first threshold voltage distribution G1.

Finally, where first and second bits BIT1 and BIT2 are "0" (CASE24), the threshold voltage of first memory cell MC1 is maintained within second threshold voltage distribution G2, and the threshold voltage of second memory cell MC2 is increased to within second threshold voltage distribution G2.

Figure 14A:
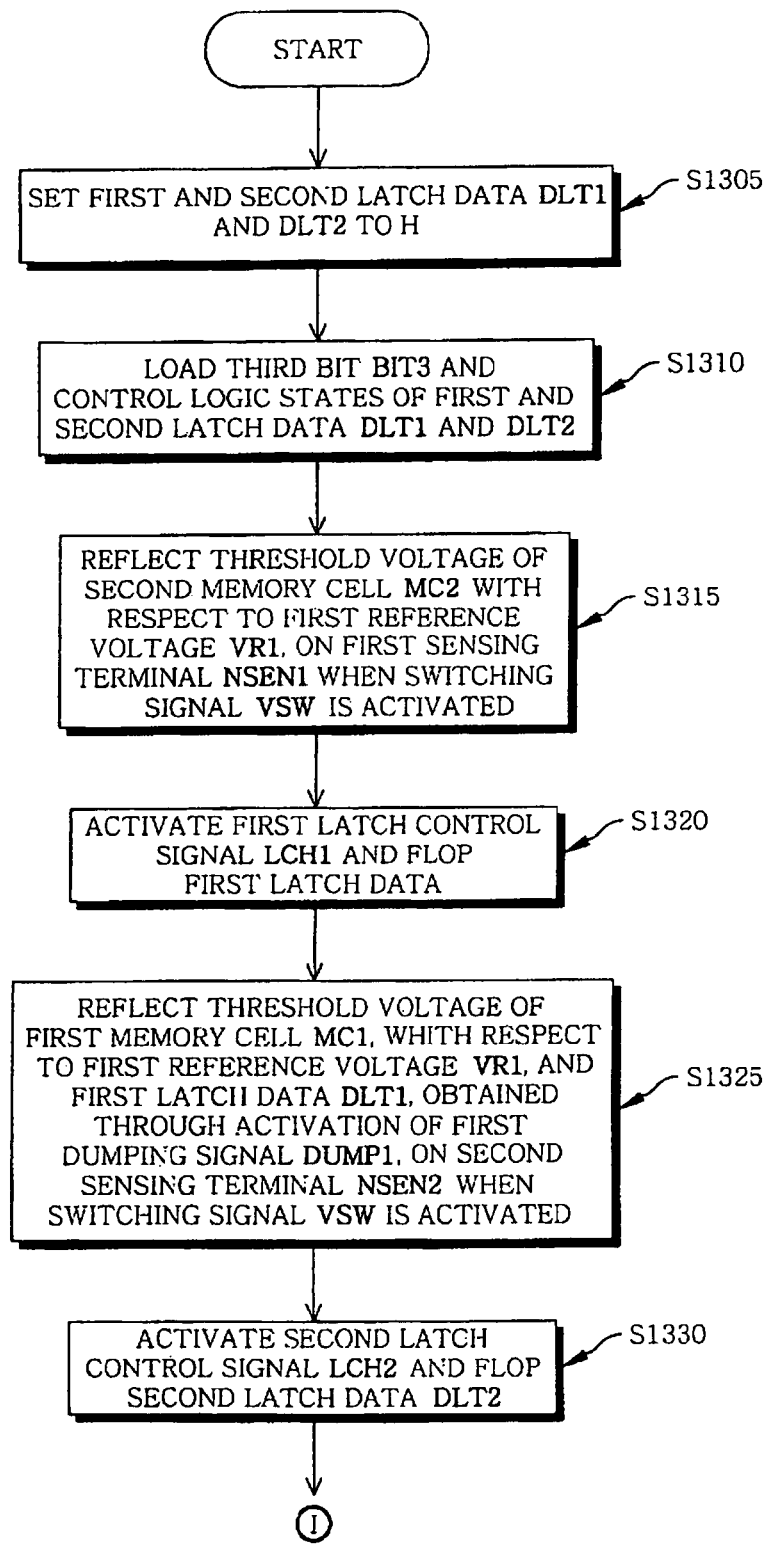
FIGS. 14A and 14B are flowcharts illustrating a third page programming operation in the programming method.
Figure 14B:
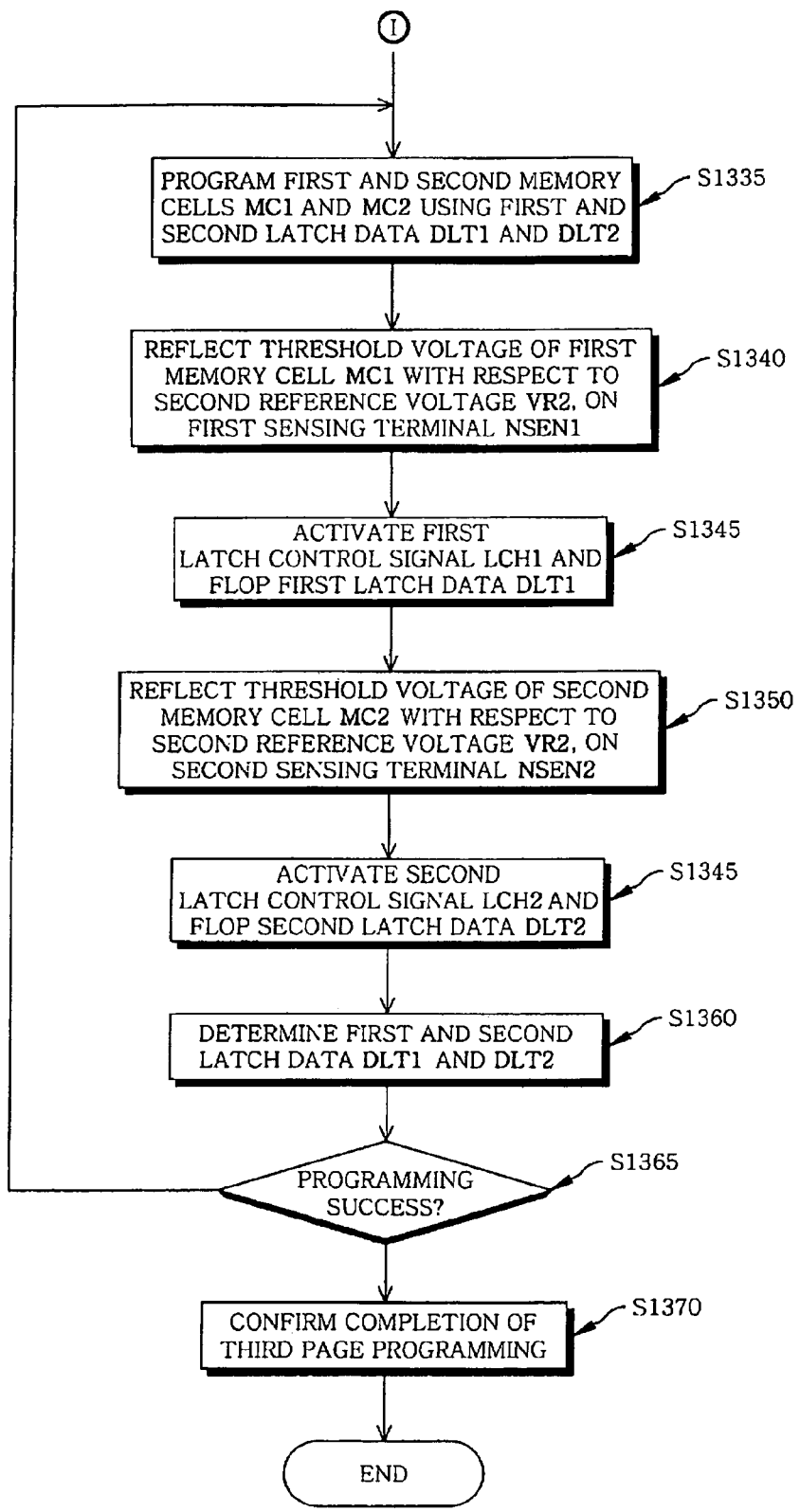
Figure 15A:
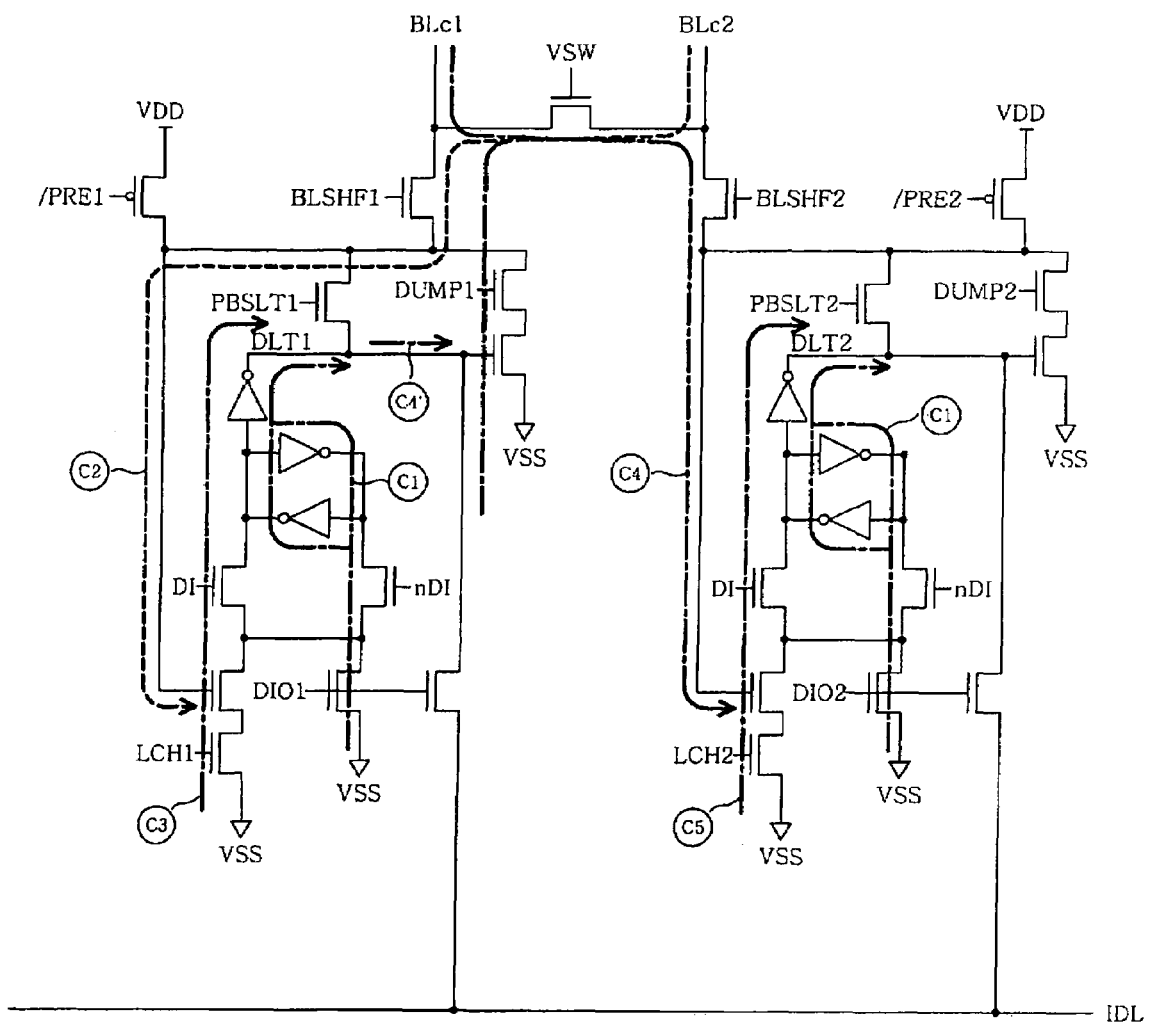
FIGS. 15A and 15B are data flow diagrams corresponding to the flowcharts of FIGS. 14A and 14B.
Figure 15B:
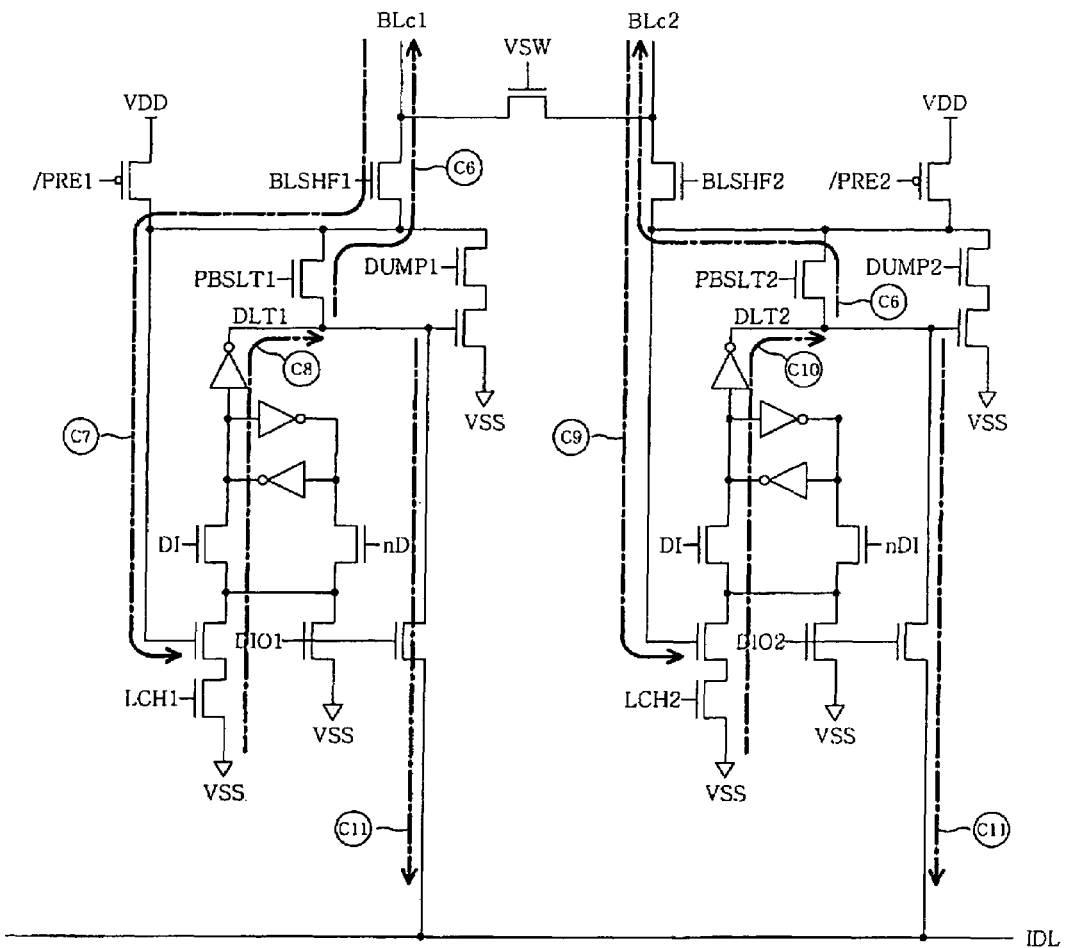

FIGS. 14A and 14B are flowcharts illustrating a third page programming operation in the programming method. FIGS. 15A and 15B are data flow diagrams corresponding to the flowcharts of FIGS. 14A and 14B. In the third page programming operation, the threshold voltages of first and second memory cells MC1 and MC2 are programmed to within third threshold voltage distribution G3 depending on the logic state of third bit BIT3.

Referring to FIGS. 14A and 14B, in a step S1305, first and second latch data DLT1 and DLT2 are set to logic state "high".

In a step S1310, the third bit BIT3 is loaded as first latch data DLT1 and second latch data DLT2 (See, C1 in FIG. 15A). In particular, where third bit BIT3 is "0", inverted input signal nDI is activated to logic state "high" so that first latch data DLT1 and second latch data DLT2 are latched as logic state "low". On the other hand, where third bit BIT3 is "1", input signal DI is activated to logic state "high", and first and second latch data DLT1 and DLT2 are maintained in logic state "high".

Next, in a step S1315, the level of the threshold voltage of second memory cell MC2 relative to first reference voltage VR1 is reflected, or indicated on first sensing terminal NSEN1 (See, C2 in FIG. 15A). Switching signal VSW is activated to logic state "high", so that second common bit line BLc2 is connected to first common bit line BLc1.

Next, in a step S1320, input signal DI is activated to logic state "high" and first latch data DLT1, which was loaded in step S1310, is selectively switched based on the voltage level of first sensing terminal NSEN1 obtained in step S1315 (See, C3 in FIG. 15A) while input signal DI is activated.

In particular, where third bit BIT3 is "0", first latch data DLT1 will be switched from logic state "low" to logic state "high" if second bit BIT2 is "0". Where third bit BIT3 is "1", first latch data DLT1 will be maintained in logic state "high". Where second bit BIT2 is "1" and third bit BIT3 is "0", first latch data DLT1 will be maintained in logic state "low".

Next, in a step S1325, first dumping signal DUMP1 is activated to logic state "high" and the level of the threshold voltage of first memory cell MC1 relative to first reference voltage VR1 and first latch data DLT1 are indicated on second sensing terminal NSEN2 (See, C4 and C4' in FIG. 15A). In addition, switching signal VSW is activated to logic state "high" so that first common bit line BLc1 is connected to second common bit line BLc2.

Next, in a step S1330, input signal DI is activated to logic state "high" and second latch data DLT2, which was loaded in step S1310, is selectively switched based on the voltage level of second sensing terminal NSEN2 obtained in step S1325 (See, C5 in FIG. 15A) while input signal DI is activated.

Where third bit BIT3 is "0", second latch data DLT2 is switched from logic state "low" to logic state "high" when first latch data DLT1 is in logic state "low" and first bit BIT1 is "0".

FIG. 16 illustrates the logic states of first and second latch data DLT1 and DLT2 after step S1330 has been performed. For example, in FIG. 16, CASE31 through CASE34 show cases where third bit BIT3 is "0". Where first and second bits BIT1 and BIT2 are "1" (CASE31), first latch data DLT1 and second latch data DLT2 are both maintained in logic state "low".

Where first bit BIT1 is "1" and second bit BIT2 is "0" (CASE32), first latch data DLT1 is switched to logic state "high", and second latch data DLT2 is maintained in logic state "low".

Where first bit BIT1 is "0" and second bit BIT2 is "1" (CASE33), first latch data DLT1 is maintained in logic state "low" and second latch data DLT2 is switched to logic state "high".

Where first and second bits BIT1 and BIT2 are "0" (CASE34), first latch data DLT1 is switched to logic state "high" and second latch data DLT2 is maintained in logic state "low".

Finally, where third bit BIT3 is "1" (CASE35), first latch data DLT1 and second latch data DLT2 are both maintained in logic state "high" regardless of first and second bits BIT1 and BIT2.

Next, in a step S1335, first and second memory cells MC1 and MC2 are programmed using first and second latch data DLT1 and DLT2 switched in steps S1320 and S1330 (See, C6 in FIG. 15B). Where third bit BIT3 is "1", the threshold voltage of first memory cell MC1 is maintained in its previous state. In contrast, where third bit BIT3 is "0", the threshold voltage of first or second memory cell MC1 or MC2 is increased third threshold voltage distribution G3.

Next, in a step S1340, the level of the threshold voltage of first memory cell MC1 relative to second reference voltage VR2 is reflected on first sensing terminal NSEN1 through first common bit line BLc1 (See, C7 in FIG. 15B).

In a step S1345, first latch control signal LCH1 is generated as a pulse with logic state "high", and input signal DI is activated to logic state "high". As a result, first latch data DLT1 is selectively switched from logic state "low" to logic state "high" depending on the voltage level of first sensing terminal NSEN1 (See, C8 in FIG. 15B).

In a step S1350, the level of the threshold voltage of second memory cell MC2 relative to second reference voltage VR2 is reflected on second sensing terminal NSEN2 through second common bit line BLc2 (See, C9 in FIG. 15B).

In a step S1355, second latch control signal LCH2 is generated as a pulse with logic state "high", and input signal DI is activated to logic state "high". As a result, second latch data DLT2 is selectively switched from logic state "low" to logic state "high" depending on the voltage level of second sensing terminal NSEN2 (See, C10 in FIG. 15B).

In a step S1360, first output control signal DIO1 and second output control signal DIO2 are simultaneously or sequentially generated as pulses with logic level "high" so that the logic states of first and second latch data DLT1 and DLT2 are read and output from the semiconductor memory device (See, C11 in FIG. 15B). In a step S1365, a programming success or failure is determined.

Where a programming failure is detected, steps S1335 through S1365 are repeated with an incrementally increasing word line voltage applied to memory cells MC1 and MC2 in step S1335.

Where a programming success is determined, the third page programming operation is completed is confirmed in a step S1370.

Figure 17:
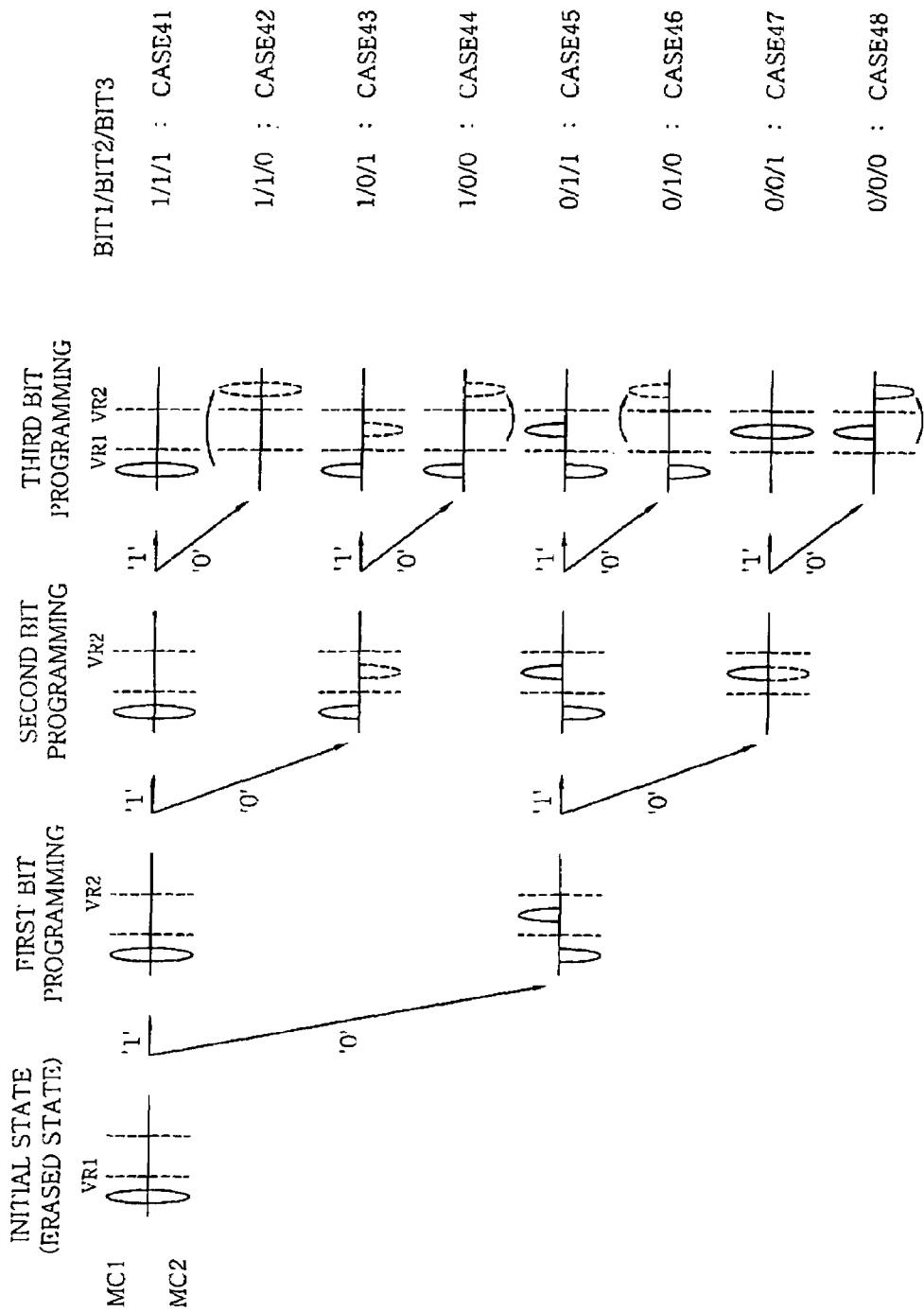
FIG. 17 is a diagram illustrating variation in the threshold voltages of first and second memory cells after the third page programming operation has been performed.

FIG. 17 is a diagram showing variation in the threshold voltages of first and second memory cells MC1 and MC2 after the third page programming operation has been performed.

Referring to FIG. 17, where all of first, second, and third bits BIT1, BIT2 and BIT3 are "1" (CASE41), the threshold voltages of first and second memory cells MC1 and MC2 are maintained in the erased state, i.e., within first threshold voltage distribution G1.

Where first and second bits BIT1 and BIT2 are "1", and third bit BIT3 is "0" (CASE42), the threshold voltages of first and second memory cells MC1 and MC2 are increased to within third threshold voltage distribution G3.

Where first bit BIT1 is "1", second bit BIT2 is "0" and third bit BIT3 is "1" (CASE43), the threshold voltage of first memory cell MC1 is maintained within first threshold voltage distribution G1, and the threshold voltage of second memory cell MC2 is maintained within second threshold voltage distribution G2.

Where first bit BIT1 is "1", second bit BIT2 is "0", and third bit BIT3 is "0" (CASE44), the threshold voltage of first memory cell MC1 is maintained at first threshold voltage distribution G1, and the threshold voltage of second memory cell MC2 is increased to within threshold voltage distribution G3.

Where first bit BIT1 is "0", second bit BIT2 is "1" and third bit BIT3 is "1" (CASE45), the threshold voltage of first memory cell MC1 is maintained within second threshold voltage distribution G2, and the threshold voltage of second memory cell MC2 is maintained within first threshold voltage distribution G1.

Where first bit BIT1 is "0", second bit BIT2 is "1" and third bit BIT3 is "0" (CASE46), the threshold voltage of first memory cell MC1 is increased to within third threshold voltage distribution G3, and the threshold voltage of second memory cell MC2 is maintained within first threshold voltage distribution G1.

Where first bit BIT1 is "0", second bit BIT2 is "0", and third bit BIT3 is "1" (CASE47), the threshold voltages of first and second memory cells MC1 and MC2 are maintained within second threshold voltage distribution G2.

Where first, second and third bits BIT1, BIT2 and BIT3 are all "0" (CASE48), the threshold voltage of first memory cell MC1 is maintained within second threshold voltage distribution G2, and the threshold voltage of second memory cell MC2 is increased to within third threshold voltage distribution G3.

In the above-described method of programming the nonvolatile semiconductor memory device, the threshold voltages of first and second memory cells MC1 and MC2 are controlled and modified depending on the respective logic states first through third bits BIT1, BIT2 and BIT3, which are provided to the nonvolatile semiconductor memory device in a sequence. For each bit, a programming success or failure is determined by one or two verify read operations. Accordingly, by using this programming method, the overall operating speed of the nonvolatile semiconductor memory device can be remarkably improved during programming.

Where first through third bits BIT1 to BIT3 are "1", "1" and "0", respectively, the threshold voltages of first and second memory cells MC1 and MC2 are increased to within third threshold voltage distribution G3.

First bit BIT1 is mapped onto the level of threshold voltage of first memory cell MC1 relative to first reference voltage VR1. In particular, where first bit BIT1 is "1", threshold voltage of first memory cell MC1 is lower than first reference voltage VR1, and where first bit BIT1 is "0", the threshold voltage of first memory cell MC1 is higher than first reference voltage VR1.

Similarly, second bit BIT2 is mapped to the level of the threshold voltage of second memory cell MC2 relative to first reference voltage VR1.

Meanwhile, third bit BIT3 is mapped to the levels of the threshold voltages of first and second memory cells MC1 and MC2 relative to second reference voltage VR2. Where third bit BIT3 is "1", the threshold voltage of first and second memory cells MC1 and MC2 are maintained below second reference voltage VR2. However, where third bit BIT3 is "0", the levels of the threshold voltage(s) of first memory cell MC1 and/or second memory cell MC2 are increased above second reference voltage VR2.

A read method for the nonvolatile semiconductor memory device illustrated in FIG. 5 is described below in accordance with one embodiment of the present invention. According to this method, first through third bits BIT1 to BIT3 do not necessarily have to be read in a particular sequence.

Figure 18A:
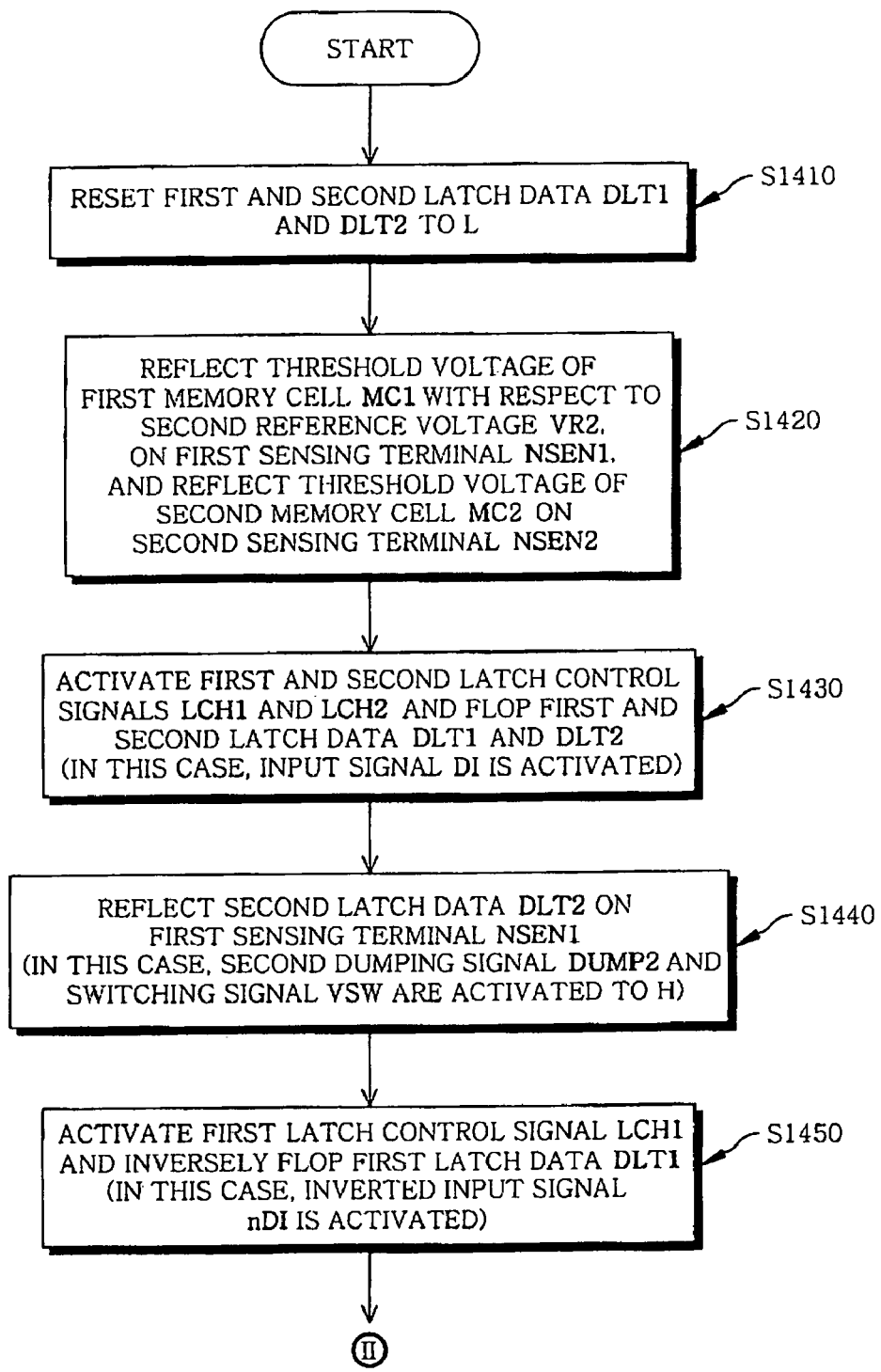
FIGS. 18A and 18B are flowcharts illustrating a first page reading step in a read method for the nonvolatile semiconductor memory device according to one embodiment of the invention.
Figure 18B:
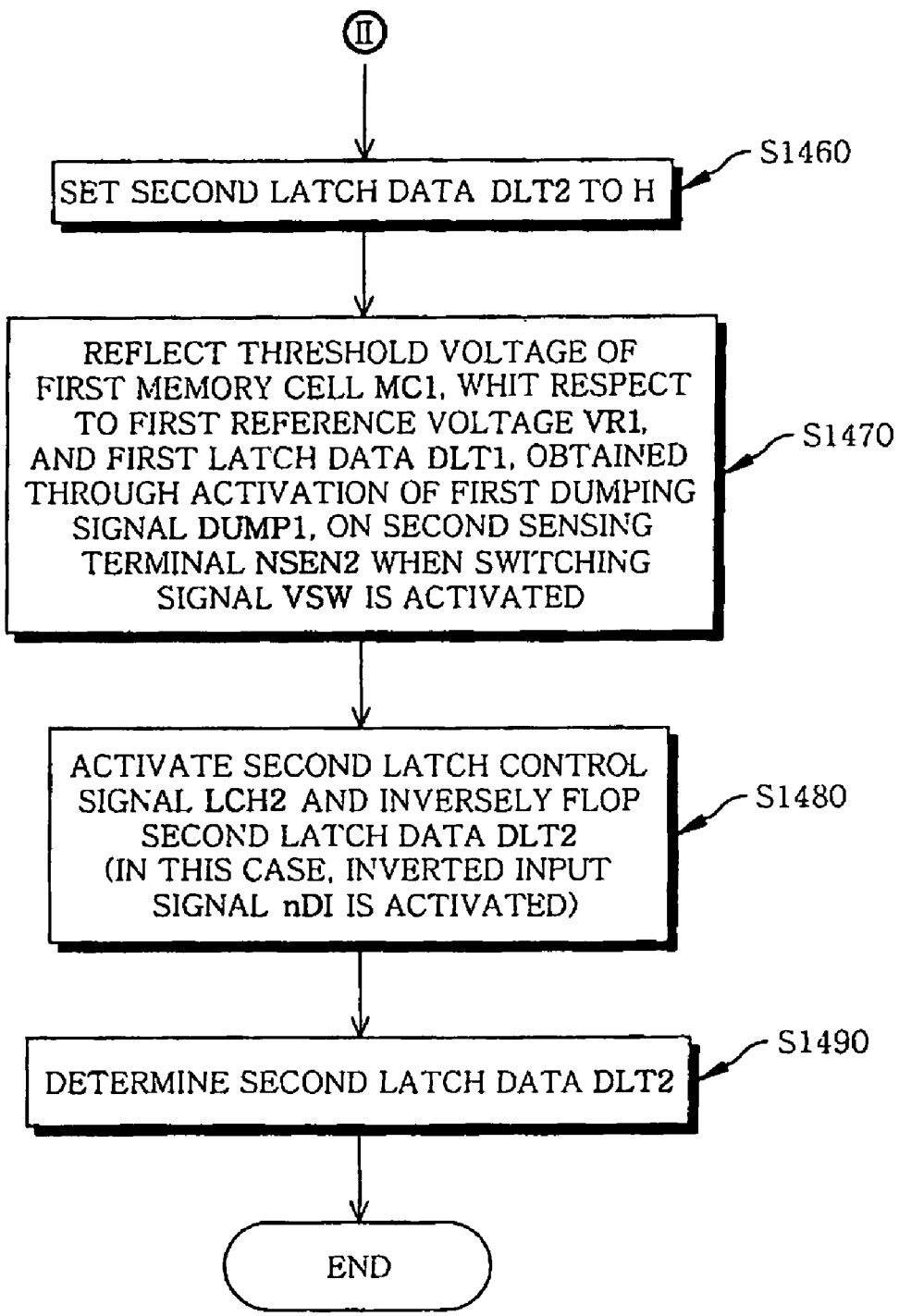
Figure 19A:
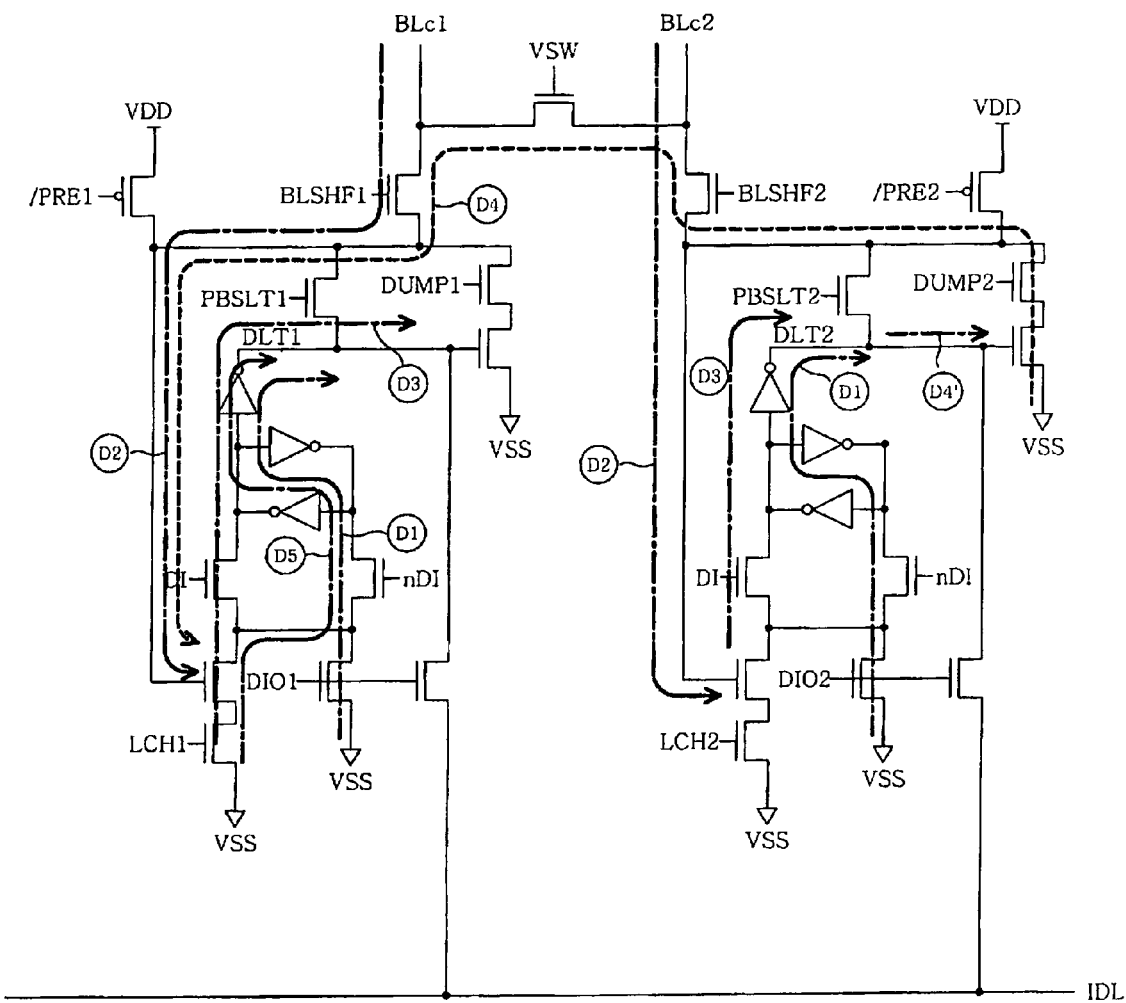
FIGS. 19A and 19B are data flow diagrams corresponding to the flowcharts of FIGS. 18A and 18B.
Figure 19B:
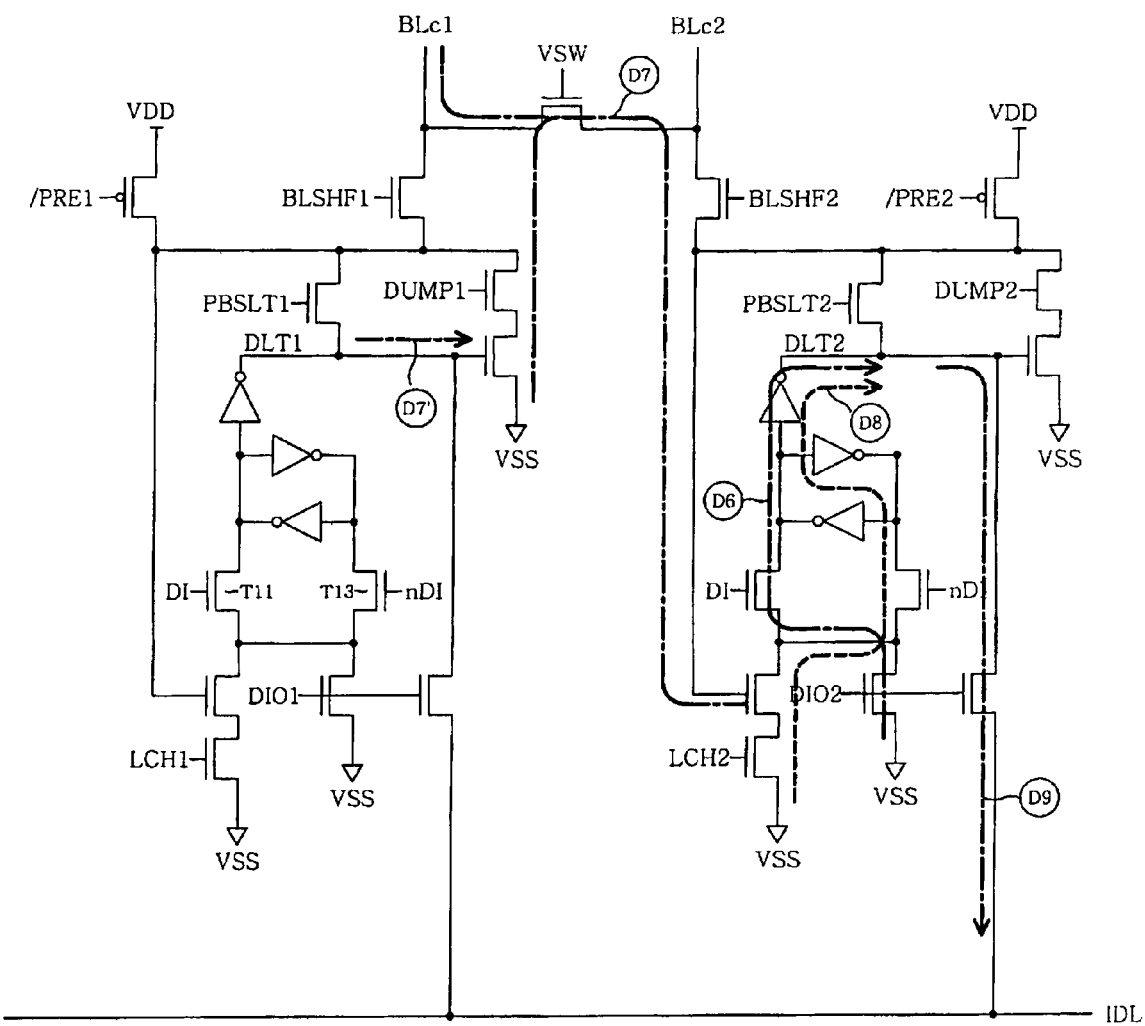

FIGS. 18A and 18B are flowcharts illustrating a first page reading operation in the read method. FIGS. 19A and FIG. 19B are data flow diagrams corresponding to the flowcharts of FIGS. 18A and 18B.

Referring to FIGS. 18A and 18B, inverted input signal nDI is activated to logic state "high" and first and second latch data DLT1 and DLT2 are reset to logic state "low" (See, D1 in FIG. 19A) while inverted input signal nDI is activated.

Next, in a step S1420, the level of the threshold voltage of first memory cell MC1 relative to second reference voltage VR2 is reflected on first sensing terminal NSEN1, and the level of the threshold voltage of second memory cell MC2 relative to second reference voltage VR2 is reflected on second sensing terminal NSEN2 (See, D2 in FIG. 19A).

Next, in a step S1430, first and second latch control signals LCH1 and LCH2 are generated as pulses with logic level "high", and input signal DI is activated to logic state "high". First and second latch data DLT1 and DLT2 are selectively switched from logic state "low" to logic state "high" depending on the voltage level of first and second sensing terminals NSEN1 and NSEN2 (See, D3 in FIG. 19A). As a result, in cases CASE42 and CASE46 in FIG. 17, first latch data DLT1 is switched to logic state "high", and in cases CASE42, CASE44 and CASE48 of FIG. 17, second latch data DLT2 is switched to logic state "high".

Next, in a step S1440, a second dumping signal DUMP2 and switching signal VSW are activated to logic state "high" and the logic state of second latch data DLT2 is reflected on first sensing terminal NSEN1 (See, D4 and D4' in FIG. 19A).

In a step S1450, inverted input signal nDI is activated to logic state "high" (See, D5 in FIG. 19A) and first latch control signal LCH1 is activated to logic state "high" so that first latch data DLT1 switches from logic state "high" to logic state "low" (See, D4 in FIG. 19A). As a result, first latch data DLT1 is only in logic state "high" in case CASE42 of FIG. 17. First latch data DLT1 in logic state "low" in cases other than CASE42.

In a step S1460, second latch data DLT2 is set to logic state "high" (See, D6 in FIG. 19B).

Next, in steps S1470 and S1480, second latch data DLT2 is switched from logic state "high" to logic state "low" based on logic state of first memory cell MC1 and first latch data switched in a step S1450.

In particular, in step S1470, the level of the threshold voltage of first memory cell MC1 relative to first reference voltage VR1, and first latch data DLT1 are reflected on second sensing terminal NSEN2 (See, D7 and D7' in FIG. 19B). During step S1470, switching signal VSW is activated to logic state "high" so that first common bit line BLc1 is connected to the second common bit line BLc2, and first dumping signal DUMP1 is activated to logic state "high".

In step S1480, second latch data DLT2 switches from logic state "high" to logic state "low" based on the voltage level of second sensing terminal NSEN2 obtained in step S1470 (See, D8 in FIG. 19B). During step S1480, inverted input signal nDI is activated to logic state "high".

Variation in the logic state of second latch data DLT2 in step S1480 is described below. In particular, where the threshold voltage of first memory cell MC1 is lower than first reference voltage VR1 (CASE41, CASE43 and CASE44 of FIG. 17) and where first latch data DLT1 is in logic state "high" (CASE42 of FIG. 17), second latch data DLT2 switches from logic state "high" to logic state "low". Otherwise (e.g., CASE45 to CASE 48 in FIG. 17), first latch data DLT1 remains at logic state "high".

In a step S1490, second output control signal DIO2 is generated as a pulse with logic state "high", and the logic state of second latch data DLT2 is read and output from the semiconductor memory device so that the logic state of first bit BIT1 can be identified (See, D9 in FIG. 19B).

Where the logic state of second latch data DLT2 output in step S1490 has logic state "high", first bit BIT1 is "1", and where the logic state of second latch data DLT2 output in step S1490 has logic state "low", first bit BIT1 is "0".

Accordingly, the above-described read method can be used to determine the value of first bit BIT1 in a single read operation.

Figure 20A:
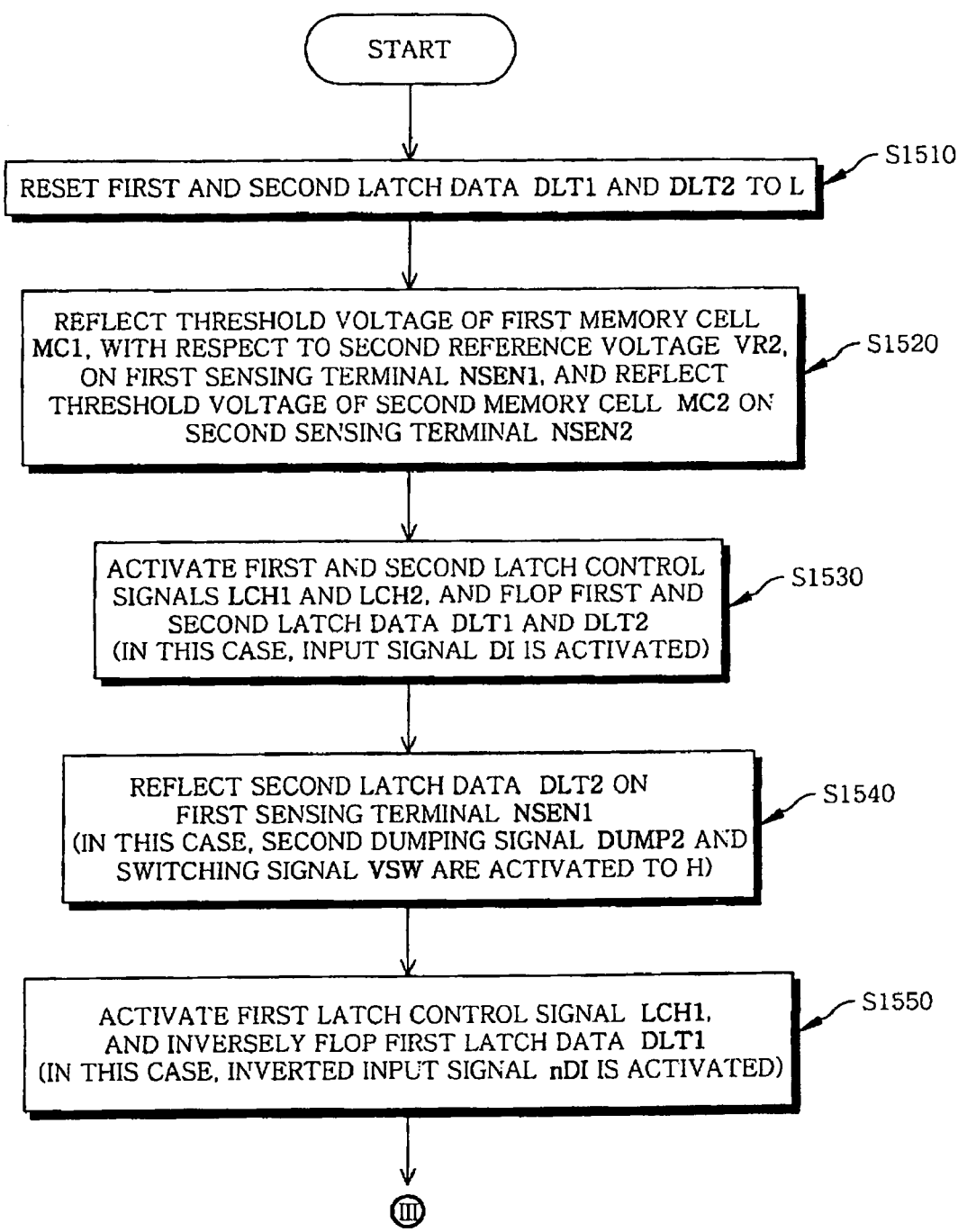
FIGS. 20A and 20B are flowcharts illustrating a second page reading step in the read method.
Figure 20B:
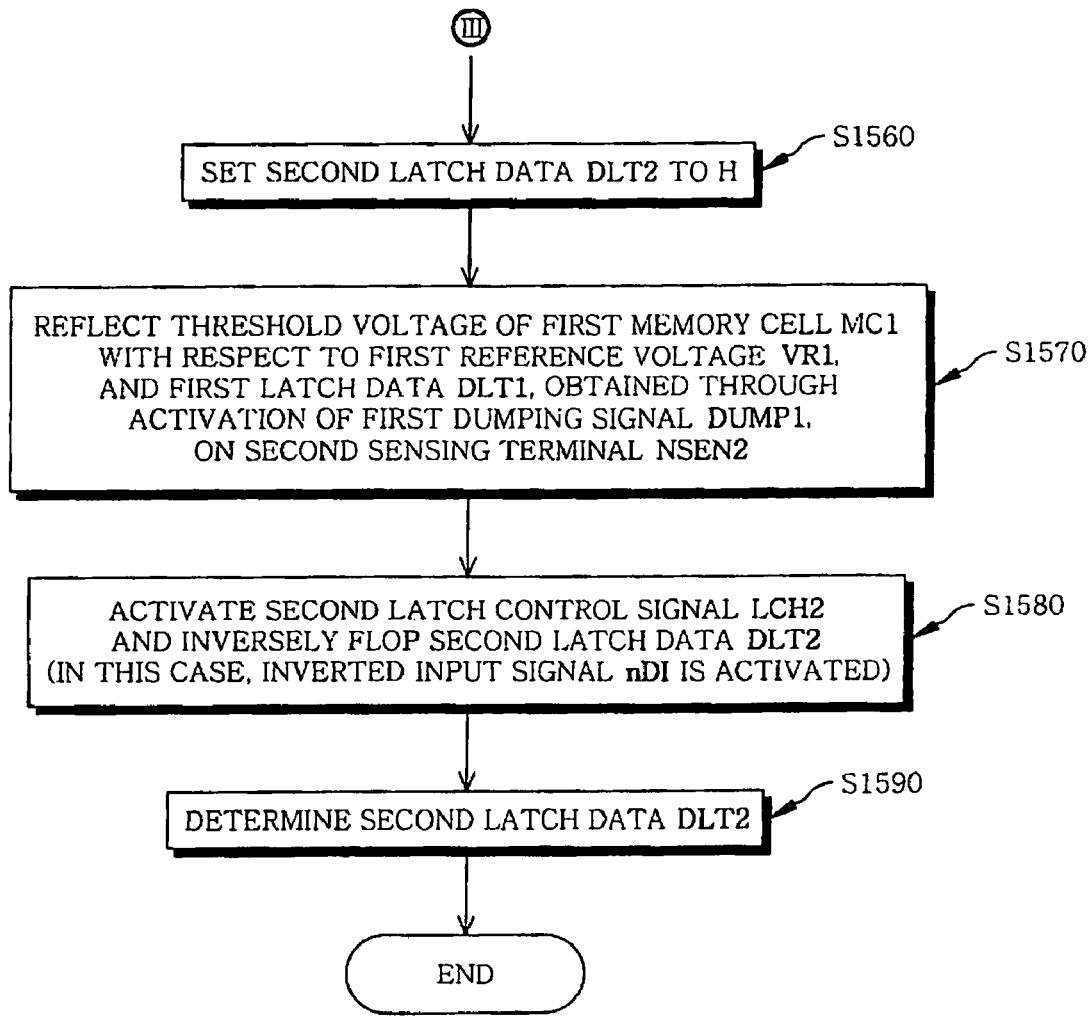
Figure 21A:
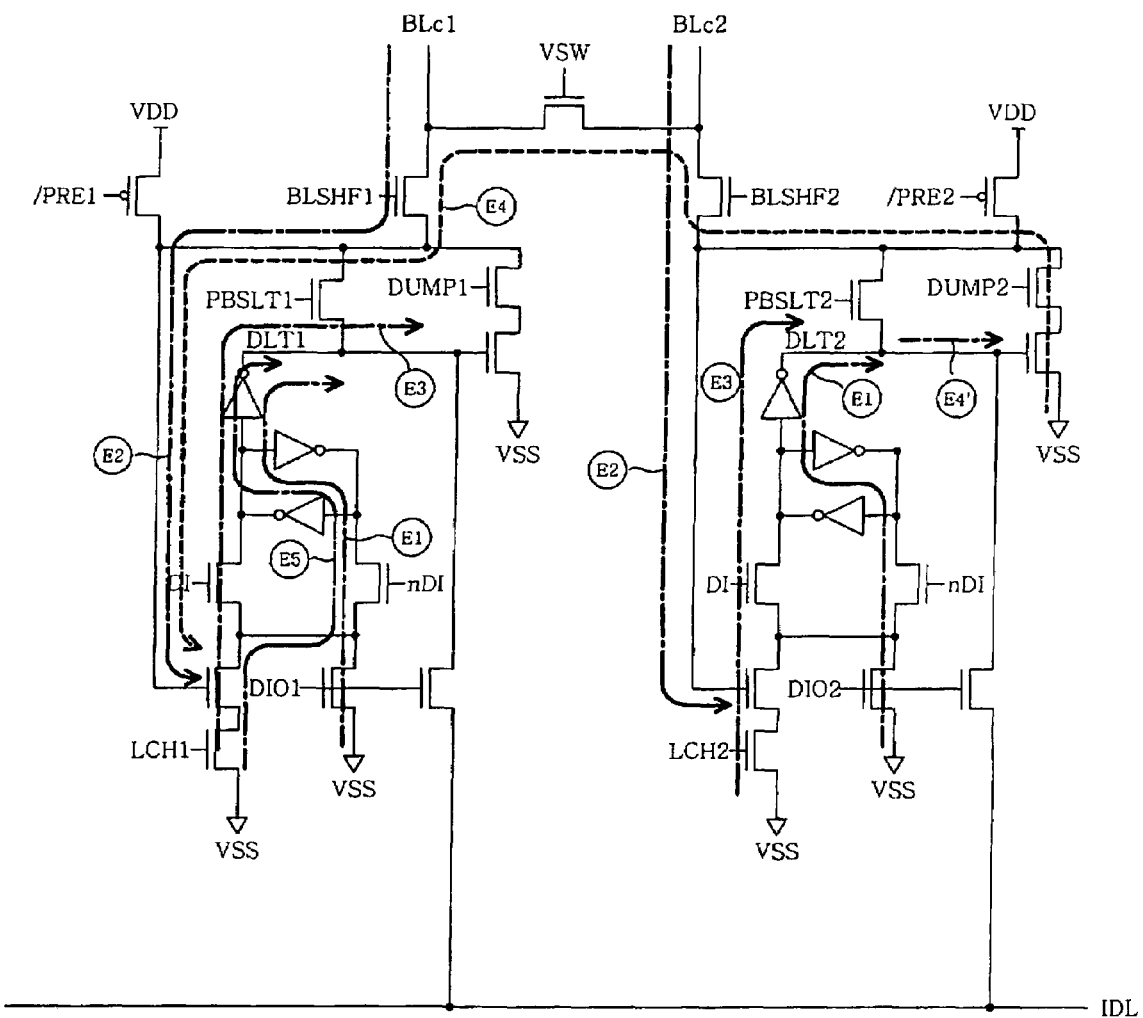
FIGS. 21A and 21B are data flow diagrams corresponding to the flowcharts of FIGS. 20A and 20B.
Figure 21B:
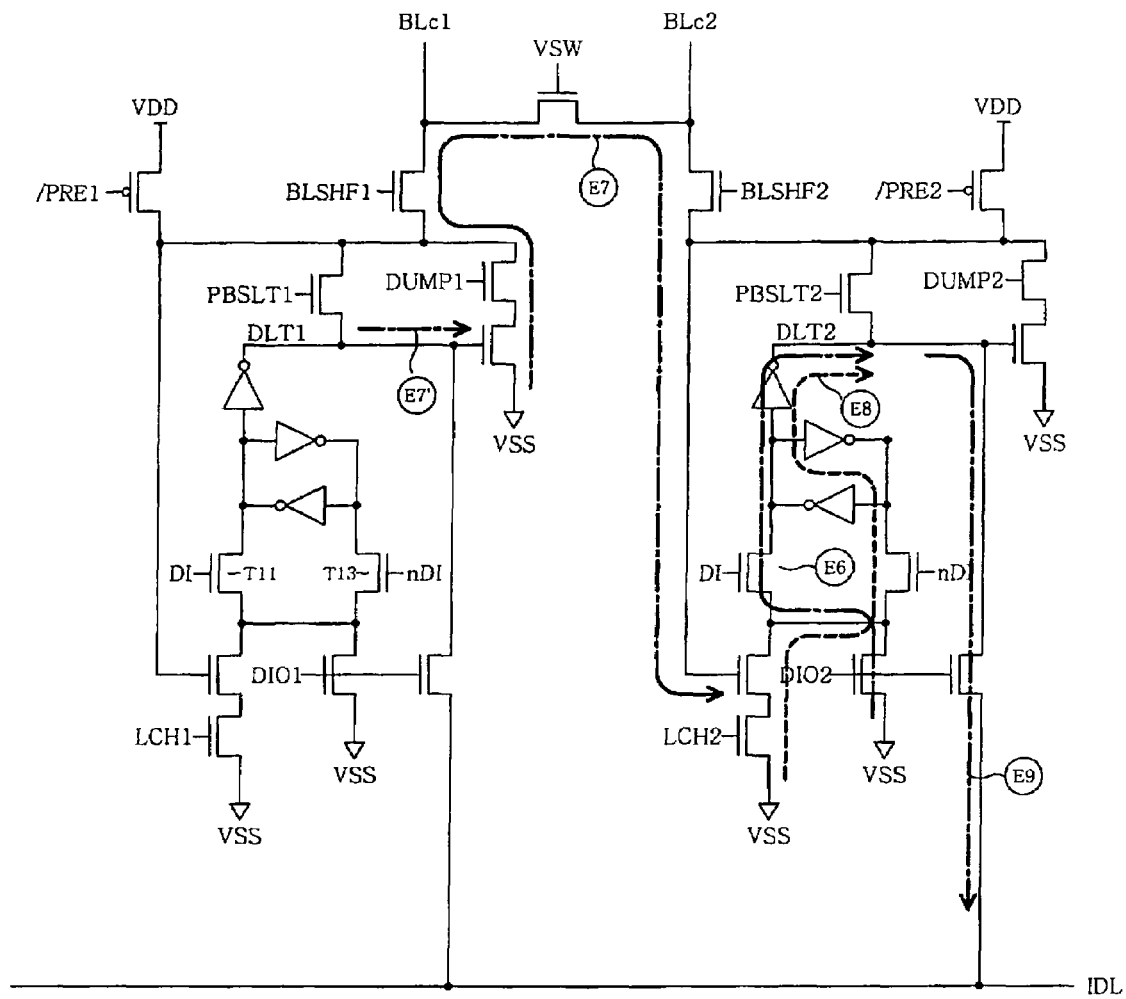

FIGS. 20A and 20B are flowcharts illustrating a second page reading step in the read method for the nonvolatile semiconductor memory device. FIGS. 21A and 21B are data flow diagrams corresponding to the flowcharts of FIGS. 20A and 20B.

Referring to FIGS. 20A and 20B, in a step S1510, inverted input signal nDI is activated to logic state "high" and first and second latch data DLT1 and DLT2 are reset to logic state "low" (See, E1 in FIG. 21A).

Further, in a step S1520, the level of the threshold voltage of first memory cell MC1 relative to second reference voltage VR2 is reflected on first sensing terminal NSEN1, and the level of the threshold voltage of second memory cell MC2 relative to second reference voltage VR2 is reflected on second sensing terminal NSEN2 (See, E2 in FIG. 21A).

In a step S1530, first and second latch control signals LCH1 and LCH2 are generated as pulses with logic level "high", and input signal DI is activated to logic state "high". In this case, first and second latch data DLT1 and DLT2 are switched from logic state "low" to logic state "high" depending on the voltage levels of first and second sensing terminals NSEN1 and NSEN2 (See, E3 in FIG. 21A). As a result, in cases CASE42 and CASE46 of FIG. 17, first latch data DLT1 is switched to logic state "high". Further, in cases CASE42, CASE44 and CASE48 of FIG. 17, second latch data DLT2 is switched to logic state "high".

Further, in a step S1540, second latch data DLT2 is reflected on first sensing terminal NSEN1. In this case, second dumping signal DUMP2 and switching signal VSW are activated to logic state "high" (See, E4 and E4' in FIG. 21A).

Further, in a step S1550, first latch control signal LCH1 is activated to logic state "high", so that first latch data DLT1 switches from logic state "high" to logic state "low" (See, E4 in FIG. 21A). In this case, inverted input signal nDI is activated to logic state "high" (See, E5 in FIG. 21A). As a result, first latch data DLT1 is in logic state "high" only in case CASE42 of FIG. 17. In cases other than CASE42, first latch data DLT1 is in logic state "low".

In a step S1560, second latch data DLT2 is set to logic state "high" (See, E6 in FIG. 21B).

Thereafter, in steps S1570 and S1580, second latch data DLT2 is switched from logic state "high" to logic state "low" using the data of second memory cell MC2 and first latch data DLT1 switched in a step S1550.

More specifically, in step S1570, the level of the threshold voltage of second memory cell MC2 relative to first reference voltage VR1, and second latch data DLT2 are reflected on second sensing terminal NSEN2 (See, E7 and E7' in FIG. 21B). In this case, switching signal VSW is activated to logic state "high", so that first common bit line BLc1 is connected to second common bit line BLc2. First dumping signal DUMP1 is activated to logic state "high".

Further, in step S1580, second latch data DLT2 switches from logic state "high" to logic state "low" using the voltage level of second sensing terminal NSEN2 obtained in step S1570 (See, E8 in FIG. 19B). In this case, inverted input signal nDI is activated to logic state "high".

Variation in the logic state of the second latch data DLT2 in a step S1580 is described below. Where the threshold voltage of second memory cell MC2 is lower than first reference voltage VR1 (CASE41, CASE45 and CASE46 of FIG. 17) and where first latch data DLT1 is in logic state "high" (CASE42 of FIG. 17), second latch data DLT2 is switched from logic state "high" to logic state "low".

In remaining cases (CASE43, CASE44, CASE47, and CASE 48 of FIG. 17), second latch data DLT2 is maintained in logic state "high".

Next, in a step S1590, second output control signal DIO2 is generated as a pulse with logic state "high", and the logic state of second latch data DLT2 is read and output from the semiconductor memory device to identify second bit BIT2 (See, E9 in FIG. 21B).

Typically, output data having logic state "high" in step S1590 is interpreted to indicate that second bit BIT2 is "1", and output data having logic state "low" in step S1590 is interpreted to indicate that second bit BIT2 is "0".

According to the above-described method, second bit BIT2 is identified through a single read operation.

Figure 22:
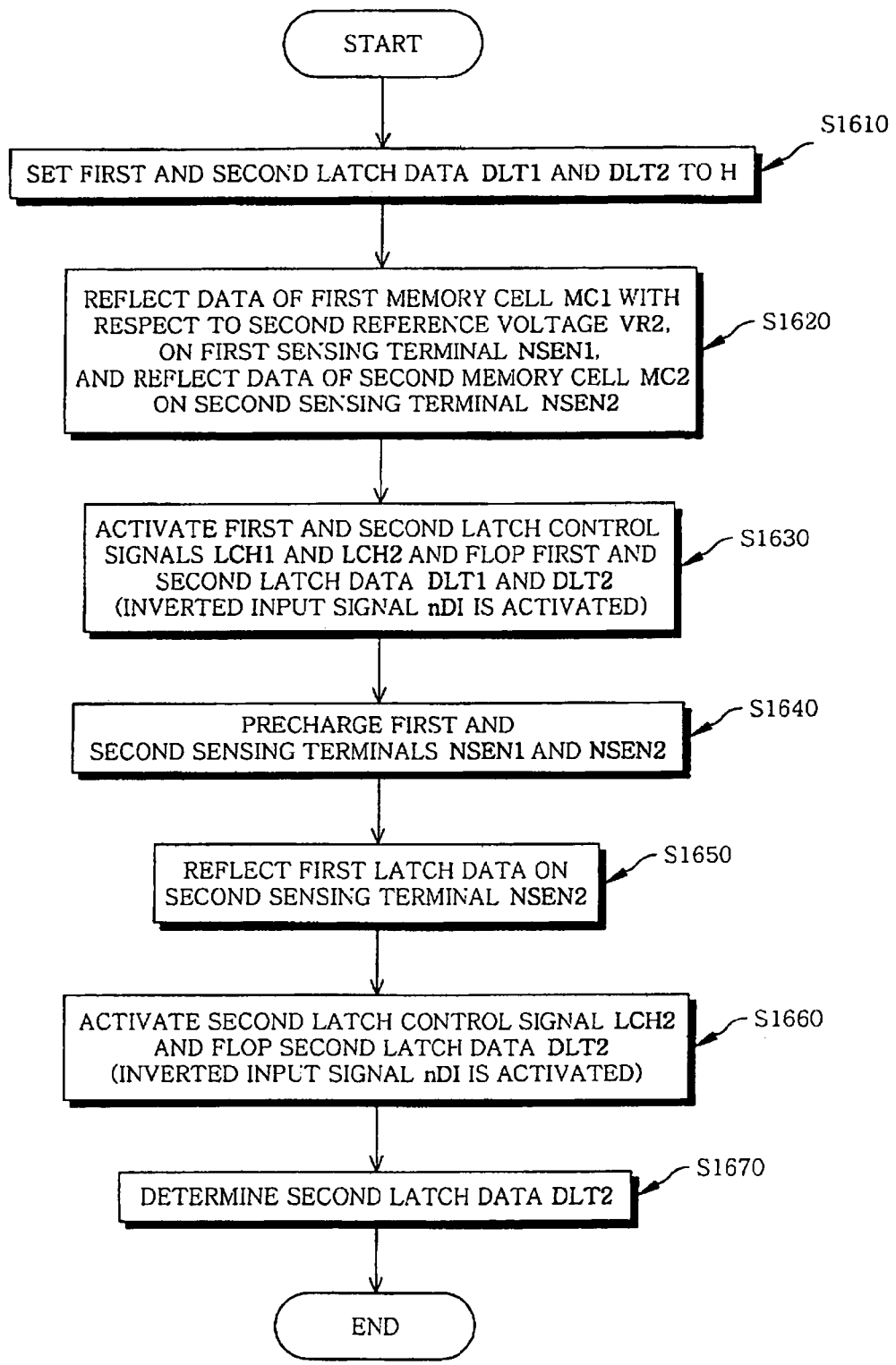
FIG. 22 is a flowchart illustrating a third page reading step in the read method; and, FIG. 23 is a data flow diagram corresponding to the flowchart of FIG. 22.
Figure 23:
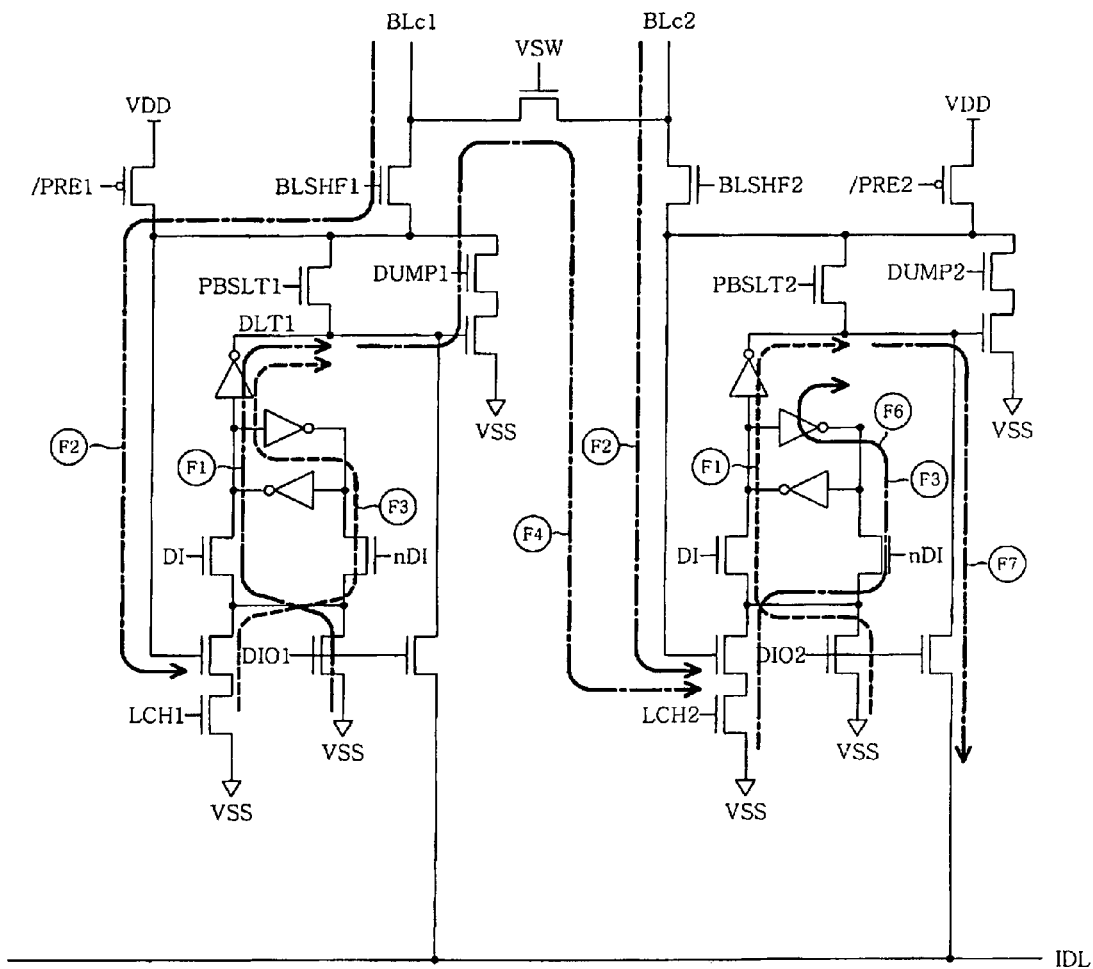

FIG. 22 is a flowchart illustrating a third page reading step in the read method described above. FIG. 23 is a data flow diagram corresponding to the flowchart of FIG. 22. In the third page reading step, the threshold voltages of first and second memory cells MC1 and MC2 are determined to read third bit BIT3.

Referring to FIGS. 23A and 23B, in a step S1610, first and second latch data DLT1 and DLT2 are set to logic state "high" (See, F1 in FIG. 23).

Next, in a step S1620, the threshold voltage of first memory cell MC1 relative to second reference voltage VR2 is reflected on first sensing terminal NSEN1, and the threshold voltage of second memory cell MC2 relative to second reference voltage VR2 is reflected on second sensing terminal NSEN2 (See, F2 in FIG. 23).

In a step S1630, first and second latch control signals LCH1 and LCH2 are generated as pulses with logic level "high", and inverted input signal nDI is activated to logic state "high". In this case, the first and second latch data DLT1 and DLT2 are selectively switched from logic state "high" to logic state "low" depending on the voltage levels of first and second sensing terminals NSEN1 and NSEN2 (See, F3 in FIG. 23). As a result, in cases CASE42 and CASE46 of FIG. 17, first latch data DLT1 is switched to logic state "low". Further, in cases CASE42, CASE44 and CASE48 of FIG. 17, second latch data DLT2 is switched to logic state "low".

In a step S1640, first and second sensing terminals NSEN1 and NSEN2 are precharged to supply voltage VDD.

In a step S1650, first dumping signal DUMP1 and switching signal VSW are activated to logic state "high" and first latch data DLT1 is reflected on second sensing terminal NSEN2. As a result, in cases CASE42 and CASE46 of FIG. 17, second sensing terminal NSEN2 is maintained at supply voltage VDD. However, in remaining cases, second sensing terminal NSEN2 is switched to ground voltage VSS.

Next, in a step S1660, inverted input signal nDI is activated to logic state "high" and second latch data DLT2 is switched from logic state "high" to logic state "low" based on the voltage level of the second sensing terminal NSEN2 obtained in step S1650 (See, F4 in FIG. 23). More specifically, where the threshold voltage of first or second memory cell MC1 or MC2 is higher than second reference voltage VR2 (CASE42, CASE44, CASE46 and CASE48 of FIG. 17), second latch data DLT2 is switched from logic state "high" to logic state "low". In other cases (CASE41, CASE43, CASE45 and CASE 47 of FIG. 17), second latch data DLT2 is maintained in logic state "high".

In a step S1670, second output control signal DIO2 is generated as a pulse with logic state "high", and the logic state of second latch data DLT2 is read and output from the semiconductor memory device as third bit BIT3 (See, F7 in FIG. 23). Typically, where the output data in step S1670 has logic state "high", third bit BIT3 is "1", and where the output data in step S1670 has logic state "low", third bit BIT3 is "0".

In the above-described method, third bit BIT3 can be identified through a single read operation.

In summary, using the above-described read method for the nonvolatile semiconductor memory device, each of first through third bits BIT1 to BIT3 can be identified using a single data output operation.

As described above, a nonvolatile semiconductor memory device according to selected embodiments of the present invention includes memory cells that can be programmed to any of three different threshold voltage levels, and a page buffer for controlling the memory cells.

The above-described 3-level nonvolatile semiconductor memory device has a higher degree of integration than a 2-level nonvolatile semiconductor memory device. In addition, the above-described 3-level nonvolatile semiconductor memory device tends to have higher reliability than a 4-level nonvolatile semiconductor memory device.

Further, in the 3-level nonvolatile semiconductor memory device, first and second memory cells forming a pair are separately arranged in a pair of first and second even strings and a pair of first and second odd strings. Therefore, in the 3-level nonvolatile semiconductor memory device, when the first and second memory cells in the first and second even strings are selected and driven, the first and second odd bit lines function as shielding lines. Moreover, where the first and second memory cells in the first and second odd strings are selected and driven, the first and second even bit lines function as shielding lines.

As described above, the even bit lines or the odd bit lines function as shielding lines to prevent noise and capacitative coupling, thereby improving the operating characteristics of the nonvolatile semiconductor memory device.

Moreover, first through third bits of data stored in the nonvolatile semiconductor memory device can each be read by a single data output operation. Accordingly, the nonvolatile semiconductor memory device can be efficiently operated.

The foregoing exemplary embodiments are teaching examples. Those of ordinary skill in the art will understand that various changes in form and details may be made to the exemplary embodiments without departing from the scope of the invention as defined by the following claims.

What is claimed:

1. A nonvolatile semiconductor memory device, comprising:
a memory array comprising first even and odd strings of nonvolatile memory cells connected to a first even bit line and a first odd bit line, respectively, second even and odd strings of nonvolatile memory cells connected to a second even bit line and a second odd bit line, respectively, wherein the first even bit line and the first odd bit line are selectively connected to a first common bit line during programming and read operations, and wherein the second even bit line and the second odd bit line are selectively connected to a second common bit line during programming and read operations;
a page buffer coupled to the memory array through the first and second common bit lines and configured to drive the first and second common bit lines to map first through third bits to levels of threshold voltage distributions of first and second memory cells forming a pair; and,
a row decoder configured to control a word line of a selected memory cell of the memory array;
wherein the first and second memory cells forming the pair are connected to the same word line and are arranged in the first and second even strings, respectively, or in the first and second odd strings, respectively.

2. The nonvolatile semiconductor memory device of claim 1, wherein the page buffer comprises a switch for controlling a connection between the first common bit line and the second common bit line;
a first latch block connected to the first common bit line, and configured to store first latch data; and,
a second latch block connected to the second common bit line and configured to store second latch data.

3. The nonvolatile semiconductor memory device of claim 2, wherein the first latch block comprises:
a first sensing terminal connected to the first common bit line in response to a first bit line connection signal;

a first latch unit for storing the first latch data, wherein the first latch unit is adapted to transmit data to the first sensing terminal in response to a first buffer selection signal;

a first switching unit driven to switch the first latch data in response to a voltage level of the first sensing terminal;

a first latch control unit driven to set and reset the first latch data; and, a first dumping unit driven to discharge a voltage level of the first sensing terminal based on the first latch data.

4. The nonvolatile semiconductor memory device of claim 3, wherein the first latch block further comprises a first output unit driven to output the first latch data to an internal data line.

5. The nonvolatile semiconductor memory device of claim 4, wherein the first latch block further comprises a first precharge unit driven to precharge the first sensing terminal.

6. The nonvolatile semiconductor memory device of claim 5, wherein the first latch block further comprises a first bit line connection unit for controlling an electrical connection between the first common bit line and the first sensing terminal.

7. The nonvolatile semiconductor memory device of claim 3, wherein the second latch block comprises:

a second sensing terminal connected to the second common bit line in response to a second bit line connection signal;

a second latch unit for storing the second latch data, wherein the second latch is capable of transmitting data to the second sensing terminal in response to a second buffer selection signal;

a second switching unit driven to switch the second latch data in response to a voltage level of the second sensing terminal;

a second latch control unit driven to set and reset the second latch data; and, a second dumping unit driven to discharge a voltage level of the second sensing terminal based on the second latch data.

8. The nonvolatile semiconductor memory device of claim 7, wherein the second latch block further comprises a second output unit driven to output the second latch data to an internal data line.

9. The nonvolatile semiconductor memory device of claim 8, wherein the second latch block further comprises a second precharge unit driven to precharge the second sensing terminal.

10. The nonvolatile semiconductor memory device of claim 9, wherein the second latch block further comprises a second bit line connection unit for controlling an electrical connection between the second common bit line and the second sensing terminal.

11. The nonvolatile semiconductor memory device of claim 1, wherein the nonvolatile semiconductor memory device is a NAND-type memory device.

12. The nonvolatile semiconductor memory device of claim 1, wherein the first and second memory cells are 3-level nonvolatile memory cells.

13. A method of operating a nonvolatile semiconductor memory device comprising a memory array including first even and odd strings of memory cells connected to respective first even and odd bit lines and second even and odd strings of memory cells connected to respective second even and odd bit lines, wherein the first even and odd bit lines are selectively connected to a first common bit line during data programming and read operations, and the second even and odd bit lines are selectively connected to a second common bit line during data programming and read operations, the method comprising:

primarily controlling threshold voltages of first and second memory cells based on first and second bits; and, after primarily controlling the threshold voltages of the first and second memory cells, secondarily controlling the threshold voltages of the first and second memory cells based on a third bit;

wherein the first and second memory cells are connected to the same word line and are arranged in the first and second even strings, respectively, or in the first and second odd strings, respectively.

14. The method of claim 13, wherein the threshold voltages of the first and second memory cells are secondarily controlled based on the threshold voltages of the first and second memory cells after the first and second memory cells have been primarily controlled.

15. The method of claim 13, wherein the nonvolatile semiconductor memory device is a NAND-type nonvolatile semiconductor memory device.

16. The method of claim 13, wherein the first and second memory cells are 3-level nonvolatile memory cells.

17. A method of operating a nonvolatile semiconductor memory device comprising a memory array including first even and odd strings of memory cells connected to respective first even and odd bit lines and second even and odd strings of memory cells connected to respective second even and odd bit lines, wherein the first even and odd bit lines are selectively connected to a first common bit line during data programming and read operations, and the second even and odd bit lines are selectively connected to a second common bit line during data programming and read operations, the method comprising:

(a) detecting the levels of threshold voltages of first and second memory cells relative to a second reference voltage through respective first and second common bit lines;

(b) switching first and second latch data based on respective voltage levels of the first and second common bit lines during (a);

(c) reflecting the level of the threshold voltage of the first or second memory cell relative to a first reference voltage and a voltage level of the first latch data, on the second common bit line; and, (d) switching the second latch data based on the voltage level of the second common bit line during (c);

wherein the first and second memory cells are controlled by the same word line and are arranged in the first and second even strings, respectively, or in the first and second odd strings, respectively.

18. The method of claim 17, wherein the second reference voltage is higher than the first reference voltage.

19. The method of claim 17, wherein the nonvolatile semiconductor memory device is a NAND-type nonvolatile semiconductor memory device.

20. The method of claim 17, wherein the first and second memory cells are 3-level nonvolatile memory cells.

21. A method of operating a nonvolatile semiconductor memory device comprising a memory array including first even and odd strings of memory cells connected to respective first even and odd bit lines and second even and odd strings of memory cells connected to respective second even and odd bit lines, wherein the first even and odd bit lines are selectively connected to a first common bit line during data programming and read operations, and the second even and odd bit lines are selectively connected to a second common bit line during data programming and read operations, the method comprising:

(a) detecting the levels of threshold voltages of first and second memory cells relative to a predetermined reference voltage through respective first and second common bit lines;
(b) switching first and second latch data depending on respective voltage levels of the first and second common bit lines obtained by (a);
(c) reflecting a voltage level of the first latch data on the second common bit line; and,
(d) switching the second latch data depending on a voltage level of the second common bit line obtained by (c);

wherein the first and second memory cells are controlled by the same word line and are arranged in the first and second even strings, respectively, or in the first and second odd strings, respectively.

22. The method of claim 21, wherein the nonvolatile semiconductor memory device is a NAND-type nonvolatile semiconductor memory device.

23. The method of claim 21, wherein the first and second memory cells are 3-level nonvolatile memory cells.

* * * * *